(12) United States Patent
Yamazaki

(10) Patent No.: US 6,777,249 B2
(45) Date of Patent: Aug. 17, 2004

(54) METHOD OF REPAIRING A LIGHT-EMITTING DEVICE, AND METHOD OF MANUFACTURING A LIGHT-EMITTING DEVICE

(75) Inventor: Shunpei Yamazaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 5 days.

(21) Appl. No.: 10/158,658

(22) Filed: May 30, 2002

(65) Prior Publication Data

US 2002/0181276 A1 Dec. 5, 2002

(30) Foreign Application Priority Data

Jun. 1, 2001 (JP) ......................................... 2001-167512

(51) Int. Cl.[7] ............................................. H01L 21/00
(52) U.S. Cl. ............................ 438/4; 438/22; 438/99; 257/40
(58) Field of Search ............................. 438/4, 22, 82, 438/99; 257/40

(56) References Cited

U.S. PATENT DOCUMENTS

| 4,725,558 | A | | 2/1988 | Yamazaki et al. .............. 437/2 |
|---|---|---|---|---|
| 4,806,496 | A | | 2/1989 | Suzuki et al. ................... 437/4 |
| 4,937,651 | A | | 6/1990 | Yamazaki et al. ............. 357/52 |
| 5,089,426 | A | | 2/1992 | Yamazaki et al. .............. 437/3 |
| 6,380,689 | B1 | | 4/2002 | Okuda ...................... 315/169.3 |
| 6,525,484 | B1 | * | 2/2003 | Huiberts et al. .......... 315/169.3 |
| 2002/0011978 | A1 | * | 1/2002 | Yamazaki et al. ............. 345/87 |
| 2002/0042152 | A1 | | 4/2002 | Yamazaki et al. .............. 438/4 |

FOREIGN PATENT DOCUMENTS

JP        2001-109432        4/2002

OTHER PUBLICATIONS

Tsutsui, T. et al, Electroluminescence in Organic Thin Films,' Photochemical Processes in Organized Molecular Systems, pp. 437–450, Elsevier Science Publishers, Tokyo, 1991.

Baldo, M.A. et al, Highly Efficient Phosphorescent Emission from Organic Electroluminescent Devices,' Nature, vol. 395, pp. 151–154, Sep. 10, 1998.

Baldo, M.A. et al, Very High–Efficiency Green Organic Light–Emitting Devices Based on Electrophosphorescence,' Applied Physics Letters, vol. 75, No. 1, pp. 4–6, Jul. 5, 1999.

Tsutsui, T. et al, High Quantum Efficiency in Organic Light–Emitting Devices with Iridium–Complex as a Triplet Emissive Center,' Japanese Journal of Applied Physics, vol. 38, part 2, No. 12B, pp. L1502–L1504, Dec. 15, 1999.

English Abstract re Japanese Patent Application No. 2001–109432 published Apr. 30, 2002.

* cited by examiner

Primary Examiner—Vu A. Le
Assistant Examiner—Brad Smith
(74) Attorney, Agent, or Firm—Cook, Alex, McFarron, Manzo, Cummings & Mehler, Ltd.

(57) ABSTRACT

A method of repairing a light-emitting device capable of performing high quality image display even if pinholes are formed when forming an organic compound layer is provided. Device contamination can be prevented during repair. By applying a reverse bias voltage to an organic light emitting element during fixed periods of time, the electric current flowing in the EL element during application of the reverse bias voltage is reduced. Further, by forming a cathode so as to contain as little as possible of the high mobility ions Li and Na, contamination of the device when the reverse bias is applied can be prevented. It is preferable to use AlMg and MgAg for this type of cathode.

46 Claims, 20 Drawing Sheets

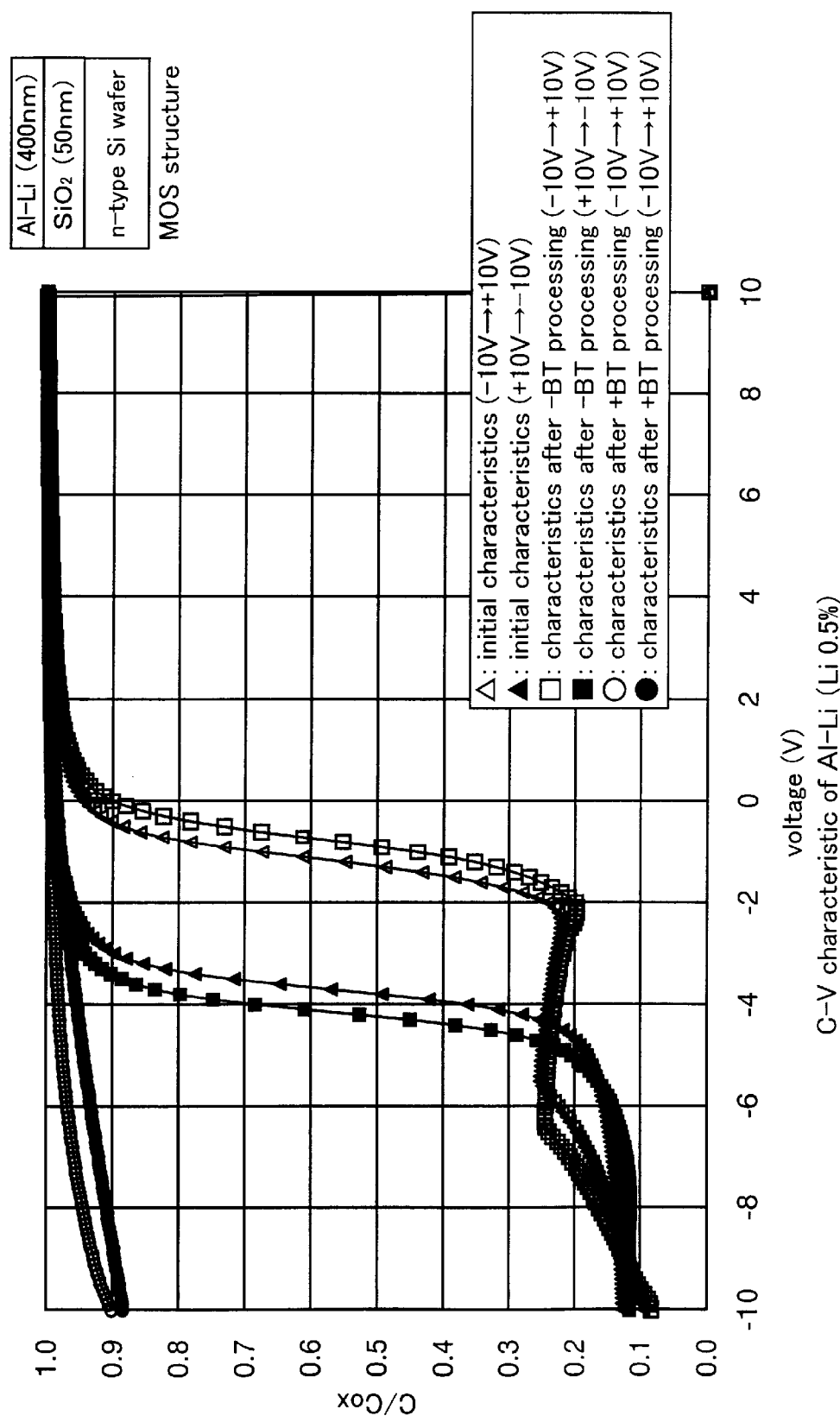

METHOD OF REPAIRING A LIGHT-EMITTING DEVICE, AND METHOD OF MANUFACTURING A LIGHT-EMITTING DEVICE

BACKGROUND OF THE INVENTION

1. Field of the Invention

The present invention relates to a method of repairing a light-emitting device, and to a method of manufacturing a light-emitting device using the repairing method in an intermediate process step. More specifically, the present invention relates to a method of repairing a light-emitting device by applying a reverse bias to organic light emitting elements, and to a method of manufacturing a light-emitting device using the repairing method.

The term "light-emitting device" is a generic term referring to organic light emitting displays in which organic light emitting elements formed on a substrate are enclosed between the substrate and a covering material, and to modules in which ICs are mounted in the organic light emitting displays.

2. Description of the Related Art

Organic light emitting elements are self light emitting, and therefore have high visibility. In addition to organic light emitting elements being optimal for making devices thinner because a backlight like that used in liquid crystal display devices (LCDs) is not needed, there is no limit on the angle of view. Light-emitting devices using organic light emitting elements have therefore been in the spotlight in recent years as electro-optical devices that can replace CRTs and LCDs.

Organic light emitting elements have a layer containing an organic compound (hereafter referred to as an organic compound layer) in which luminescence (electroluminescence) is generated by the addition of an electric field, an anode layer, and a cathode layer. Two types of luminescence exist, light emission when returning to a base state from a singlet excited state (fluorescence), and light emission when returning to a base state from a triplet excited state (phosphorescence), and it is possible to apply the repairing method of the present invention to light-emitting devices using either type of light emission.

Note that, in this specification, all layers formed between an anode and a cathode are defined as the organic compound layer. Specifically, light emitting layers, hole injecting layers, electron injecting layers, hole transporting layers, electron transporting layers, and the like are included in the term organic compound layer. Organic light emitting elements basically have a structure in which an anode, a light emitting layer, and a cathode are laminated in the order. Other structures also exist in addition to this structure, such as one in which an anode, a hole injecting layer, a light emitting layer, and a cathode are laminated in the order, and one in which an anode, a hole injecting layer, a light emitting layer, an electron transporting layer, and a cathode are laminated in the order.

Further, making a light emitting element emit light is referred to as driving the light emitting element in this specification. Light emitting elements formed by an anode, an organic compound layer, and a cathode are referred to as organic light emitting elements in this specification.

Organic light emitting elements have high rectification characteristics, and electric current flows in the organic compound if the electric potential of the anode is higher than the electric potential of the cathode. Light is emitted due to recombination of the carrier. Conversely, if the anode is at a lower electric potential than the cathode, almost no electric current will flow in the organic compound layer. From this diode structure, organic light emitting elements are also referred to as organic light emitting diodes (OLEDs).

In making organic light emitting elements, generally one electrode, either the anode of the cathode, is formed, after which the organic compound layer is formed so as to contact the electrode. The remaining electrode is then formed so as to contact the organic compound layer.

The main methods of forming the organic compound layer are a film formation method by evaporation, and a film formation method by spin coating. Whichever method is used, care is taken when performing film formation. Substrates are washed before film formation so that refuse and the like does not adhere to the substrate during film formation of the electrodes and the organic compound layer, and management of the cleanliness of a clean room within which film formation takes place is performed thoroughly.

However, even if every effort is made for cleanliness, there are cases in which refuse and the like adhere to the electrodes or other films, forming holes (pinholes) in the organic compound layer. FIG. 12A shows a simple cross sectional diagram of an organic light emitting element 200 for a case in which there is a short circuit between two electrodes 201 and 202. If a pinhole is opened in an organic compound layer 203, then the two electrodes 201 and 202 are connected in the pinhole when forming the electrode 202 on the organic compound layer 203, thus forming a short circuit in some cases. Note that portions in which two layers formed sandwiching a light emitting layer therebetween are connected through pinholes formed in the light emitting layer are hereafter referred to as defect portions 204.

The voltage-current characteristics of an organic light emitting element that does not have a defect portion are shown in FIG. 13A, and the voltage-current characteristics of an organic light emitting element that has a short circuit in a defect portion are shown in FIG. 13B.

Comparing FIGS. 13A and 13B, it can be seen that the electric current flowing in the organic light emitting element 200 when a reverse bias voltage is applied to the organic light emitting element 200 is larger for the case of FIG. 13B. This is because the two electrodes are shorted in the defect portion 204 for the case of FIG. 13B, and current therefore flows in the defect portion 204, differing from FIG. 13A.

If the two electrodes 201 and 202 are shorted in the defect portion 204, then the brightness of light emitted from the organic compound layer drops. The electric current flowing in an organic light emitting element having a defect portion when a forward bias voltage is applied is shown schematically in FIG. 12B.

It can be considered that the defect portion 204 has a resistance $R_{SC}$ therein, and thereby the two electrodes of the organic light emitting element 200 are connected for cases in which the two electrodes 201 and 202 are shorted in the defect portion 204. Consequently, if the electric current flowing in the defect portion 204 is taken as $I_{SC}$, and the electric current flowing in the organic compound layer 203 is taken as $I_{dio}$ when an electric current $I_{ori}$ flows from one electrode of the organic light emitting element, then the electric current $I_{ori}$ satisfies the equation $I_{ori}=I_{SC}+I_{dio}$.

If $I_{ori}$ is taken as fixed in the aforementioned equation $I_{ori}=I_{SC}+I_{dio}$, then the current $I_{dio}$ actually flowing in the organic compound layer 203 becomes smaller in organic light emitting elements having defect portions. If the resistance $R_{SC}$ in the defect portion 204 becomes smaller, then $I_{SC}$ increases, and therefore this tendency becomes more conspicuous and the rectification properties of the organic light emitting element 200 collapse.

If the current $I_{dio}$ flowing in the organic compound layer 203 becomes smaller, then the brightness of light emitted from the organic light emitting element 200 drops. That is, if there is a short circuit in the defect portion, then the brightness of light emitted from the organic light emitting element when a forward bias voltage is applied becomes lower compared to a case in which there is no short circuit.

Further, even if the organic compound layer is formed by laminating together a plurality of layers, if a pinhole is formed in the light emitting layer, then the hole injecting layer or the hole transporting layer will be connected to the electron injecting layer or the electron transporting layer through the pinhole. Portions in which the hole injecting layer or the hole transporting layer is connected to the electron injecting layer or the electron transporting layer also become the source of lowered brightness in light emitted from the organic light emitting element because a reverse bias electric current flows, similarly to that in the defect portion in which the electrodes are shorted. Note that, all portions in which two layers, formed sandwiching a light emitting layer therebetween, are connected through a pinhole formed in the light emitting layer are hereafter referred to generically as defect portions. The defect portions are portions in which an anode and a cathode are electrically short-circuited.

In addition, if there is a short circuit in the defect portion, then not only will the brightness of light emitted from the organic light emitting element drop, but the degradation of the organic compound layer in the vicinity of the defect portion will be promoted because electric current always flows in the defect portion.

SUMMARY OF THE INVENTION

In view of the above problems, an object of the present invention is to propose a method of repairing a defect portion.

The applicants of the present invention consider that even if a defect portion is formed in an organic light emitting element, a drop in the electric current flowing in an organic compound layer when a forward bias voltage is applied can be prevented, provided that the resistance in the defect portion is increased.

A method of increasing the resistance $R_{SC}$ in the defect portion by applying a reverse bias voltage to the organic light emitting element, causing a reverse bias electric current $I_{rev}$ to flow, is proposed.

If the reverse bias electric current $I_{rev}$ flows in the organic light emitting element, then almost all of this current flows in the defect portion that has a short circuit, and almost none flows in the organic compound layer. If an electric current $I_{SC}$ flowing in the defect portion becomes larger, then the temperature of the defect portion increases, and therefore the defect portion burns out, is gasified and vaporizes, or is oxidized or carbonized and becomes an insulator. A certain change occurs in the defect portion, and as a result, the resistance $R_{SC}$ therefore becomes larger. Note that, in this specification, the defect portion, after the resistance $R_{SC}$ has been increased by the flow of a reverse bias electric current, is referred to as a denatured layer.

If the resistance $R_{SC}$ becomes larger, then the electric current flowing in the denatured layer becomes smaller when a forward bias voltage is applied to the organic light emitting element. Instead, the electric current flowing in the organic compound layer becomes larger, and the brightness of emitted light increases.

Further, degradation of the organic compound layer existing in the vicinity of the defect portion is easily promoted because current always flows in the defect portion. However, the denatured layer has a high resistance $R_{SC}$, and therefore current does not easily flow. The promotion of degradation of the organic compound layer existing in the vicinity of the denatured layer can thus be prevented.

Materials for cathodes of the organic light emitting elements used in the present invention are considered next. It is preferable that a material having a low work function be used for the cathode because electron injection is performed there. Li and Mg are included in such materials, and their influence on the light emitting element was investigated.

The C-V (capacitance-voltage) characteristics were investigated using a test piece having a MOS (metal oxide silicon) structure. The ratio between a MOS capacitance C and an insulating film capacitance $C_{ox}$ depends upon voltage. When a clean MOS transistor having no impurities was used, $C/C_{ox}$ showed an ideal C-V characteristic unambiguously determined in response to voltage. Cases in which there is a shift from this ideal C-V characteristic show that the MOS transistor is contaminated by ionic impurities.

The initial characteristics, and the characteristics after applying a 1.7 MV/cm bias to the MOS transistor at a temperature of 150° C. for one hour were measured. A process in which a bias is applied while adding thermal shock is referred to as BT (bias temperature) processing. Taking Si as a base level, positive bias application processing (+BT processing) and negative bias application processing (-BT processing) were performed.

Measurement of the C-V characteristics was performed while increasing the electrode electric potential from -10V to +10V, and then decreasing the electrode electric potential from +10V to -10V, taking Si as the base level.

For the MOS structure, a silicon oxide film having a 50 nm film thickness was formed on a silicon substrate, and in addition, AlMg, MgAg, or AlLi was formed as an electrode on the silicon oxide film. Note that, for the measurements, the weight ratios were as follows: AlMg, Al:Mg=95:5; MgAg, Mg:Ag=90:10; and AlLi, Al:Li=90:110.

A case of using AlMg as the electrode (FIG. 17) and a case of using MgAg as the electrode (FIG. 18) show ideal characteristics in which $C/C_{ox}$ is unambiguously determined by voltage for both the initial characteristics, and the characteristics after performing BT processing. This shows that the diffusion of Mg is at a level that can be ignored even after imposing the thermal shock.

However, for a case in which AlLi was used as the electrode (FIG. 19), the resulting C-V characteristics show a large shift compared to the ideal values. In particular, a characteristic 600 showed a large variation with respect to the ideal value after performing positive bias application BT processing (+BT processing). It is thought that this is because Li$^+$ elutes from the electrode and diffuses due to electrical repulsion when the AlLi electrode has a positive electric potential. A hysteresis can also be seen in the C-V characteristics for the initial characteristics, and for the characteristics after performing negative bias application processing (-BT processing). This may be due to a very small amount of Li$^+$ that elutes by the application of a positive voltage during measurement.

The results thus show that electrodes to which high diffusion Li is added are not preferable for the structure of the present invention in which the cathode is given a positive electric potential when applying a reverse bias to the organic light emitting elements.

If a reverse bias is applied and Li+ contained in the cathode elutes, then the device will become contaminated while the defect portion is being repaired by the reverse bias application. The Li+ that elutes from the cathode has high mobility, and therefore may penetrate an interlayer insulating film, reach a TFT, and contaminate a channel layer. The TFT performance thus degrades.

Of course, structures in which high mobility Na, not only Li, is contained in the cathode are also not preferable for a similar reason. The less the amount of Li and Ni contained in the cathode becomes, the better.

Further, it can be seen that it is preferable to use electrodes that contain low diffusion Mg. For example, the use of AlMg and MgAg is extremely effective.

The organic compound layer in the light emitting element of the present invention can be formed using known organic compound materials. The organic compound layer may also be formed having an inorganic material as a portion of the organic compound layer. For example, by forming the organic compound layer using as a portion a layer that contains a low work function alkaline metal element, or an alkaline earth metal element, an increase in the injection characteristics of electrons from the cathode can be achieved. In addition, light emitting elements having superior characteristics can be formed by including an organic material capable of increasing the transportability of the injected carrier in the organic compound layer. Note that there are no particular limitations placed on the type of inorganic materials capable of being included in the organic compound layer, nor are there limitations placed on the arrangement of layers containing inorganic materials within the organic compound layer. Known inorganic materials can be freely disposed.

Note that it is also possible to use the present invention in passive type light-emitting devices, not only in active matrix type light-emitting devices.

Hereinbelow, a description is given on the structure of the present invention.

According to the present invention, there is provided a method of repairing a light-emitting device containing an organic light emitting element having an anode, a cathode, and an organic compound layer sandwiched between the anode and the cathode, characterized in that:

the concentration of at least one of Li and Na contained in the cathode is equal to or less than $1\times10^{18}$ atoms/cm$^3$, the repairing method comprising:

applying a reverse bias voltage between the anode and the cathode.

According to the present invention, there is provided a method of repairing a light-emitting device containing an organic light emitting element having an anode, a cathode, and an organic compound layer sandwiched between the anode and the cathode, characterized in that:

the concentration of at least one of Li and Na contained in the cathode is equal to or less than $1\times10^{18}$ atoms/cm$^3$, the repairing method comprising:

applying a reverse bias voltage between the anode and the cathode, thus making an electric current flow in portions at which the anode and the cathode are electrically short-circuited, causing the short-circuited portions to emit heat; and making the portions that emit heat into higher resistance portions, or insulating portions.

According to the present invention, there is provided a method of repairing a light-emitting device containing an organic light emitting element having an anode, a cathode, and an organic compound layer sandwiched between the anode and the cathode, characterized in that:

the concentration of at least one of Li and Na contained in the cathode is equal to or less than $1\times10^{18}$ atoms/cm$^3$; and the organic compound layer has a hole injecting layer, a hole transporting layer, an electron injecting layer or an electron transporting layer, and a light emitting layer, the repairing method comprising:

applying a reverse bias voltage between the anode and the cathode, thus making an electric current flow in portions at which a layer on the light emitting layer and a layer under the light emitting layer are electrically short-circuited, causing the short-circuited portions to emit heat; and making the portions that emit heat into higher resistance portions, or insulating portions.

According to the present invention, there is provided a method of repairing a light-emitting device containing an organic light emitting element having an anode, a cathode, and an organic compound layer sandwiched between the anode and the cathode, characterized in that:

the concentration of at least one of Li and Na contained in the cathode is equal to or less than $1\times10^{18}$ atoms/cm$^3$, the repairing method comprising:

applying a reverse bias voltage between the anode and the cathode, thus making at least one of the anode and the cathode penetrate into the organic compound layer, causing an electric current to flow in portions at which the anode and the cathode are in electrical contact.

According to the present invention, there is provided a method of repairing a light-emitting device, characterized in that there is the electrical current flowing in portions at which the anode and the cathode are in electrical contact, causing heat to be emitted, and making the portions that emit heat into higher resistance portions, or insulating portions.

According to the present invention, there is provided a method of repairing a light-emitting device containing an organic light emitting element having an anode, a cathode, and an organic compound layer sandwiched between the anode and the cathode, characterized in that:

the concentration of at least one of Li and Na contained in the cathode is equal to or less than $1\times10^{18}$ atoms/cm$^3$; and the organic compound layer has a hole injecting layer, a hole transporting layer, an electron injecting layer or an electron transporting layer, and a light emitting layer;

the repairing method comprising:

applying a reverse bias voltage between the anode and the cathode, thus making a layer on the light emitting layer or a layer under the light emitting layer penetrate into the light emitting layer, causing an electric current to flow in portions at which the layer on the light emitting layer and the layer under the light emitting layer are in electrical contact.

According to the present invention, there is provided a method of repairing a light-emitting device, characterized in that there is the electrical current flowing in portions at which the layer on the light emitting layer and the layer under the light emitting layer are in electrical contact, causing heat to be emitted, and making the portions that emit heat into higher resistance portions, or insulating portions.

According to the present invention, there is provided a method of repairing a light-emitting device, characterized in that the cathode is an alloy containing at least one of Be, Mg, Ca, Sr and Ba.

According to the present invention, there is provided a method of repairing a light-emitting device, characterized in that the cathode is an alloy containing magnesium.

According to the present invention, there is provided a method of repairing a light-emitting device, characterized in that the cathode is AlMg, MgAg or MgAgAl.

According to the present invention, there is provided a method of repairing a light-emitting device containing an organic light emitting element having an anode, a cathode, and an organic compound layer sandwiched between the anode and the cathode, characterized in that:

the cathode contains Mg, and at least one of Al and Ag, the repairing method comprising:

applying a reverse bias voltage between the anode and the cathode.

According to the present invention, there is provided a method of repairing a light-emitting device containing an organic light emitting element having an anode, a cathode, and an organic compound layer sandwiched between the anode and the cathode, characterized in that:

the cathode contains Mg, and at least one of Al and Ag, the repairing method comprising:

applying a reverse bias voltage between the anode and the cathode, thus causing an electric current to flow in portions at which the anode and the cathode are electrically short-circuited, causing the short-circuited portions to emit heat; and making the portions that emit heat into higher resistance portions, or insulating portions.

According to the present invention, there is provided a method of repairing a light-emitting device containing an organic light emitting element having an anode, a cathode, and an organic compound layer sandwiched between the anode and the cathode, characterized in that:

the cathode contains Mg, and at least one of Al and Ag; and the organic compound layer has a hole injecting layer, a hole transporting layer, an electron injecting layer or an electron transporting layer, and a light emitting layer, the repairing method comprising:

applying a reverse bias voltage between the anode and the cathode, thus making an electric current flow in portions at which a layer on the light emitting layer and a layer under the light emitting layer are electrically short-circuited, causing the short-circuited portions to emit heat; and making the portions that emit heat into higher resistance portions, or insulating portions.

According to the present invention, there is provided a method of repairing a light-emitting device containing an organic light emitting element having an anode, a cathode, and an organic compound layer sandwiched between the anode and the cathode, characterized in that:

the cathode contains Mg, and at least one of Al and Ag, the repairing method comprising:

applying a reverse bias voltage between the anode and the cathode, thus making at least one of the anode and the cathode penetrate into the organic compound layer, causing an electric current to flow in portions at which the anode and the cathode are in electrical contact.

According to the present invention, there is provided a method of repairing a light-emitting device, characterized in that there is the electrical current flowing in portions at which the anode and the cathode are in electrical contact, causing heat to be emitted, and making the portions that emit heat into higher resistance portions, or insulating portions.

According to the present invention, there is provided a method of repairing a light-emitting device containing an organic light emitting element having an anode, a cathode, and an organic compound layer sandwiched between the anode and the cathode, characterized in that:

the cathode contains Mg, and at least one of Al and Ag; and the organic compound layer has a hole injecting layer, a hole transporting layer, an electron injecting layer or an electron transporting layer, and a light emitting layer, the repairing method comprising:

applying a reverse bias voltage between the anode and the cathode, thus making a layer on the light emitting layer or a layer under the light emitting layer penetrate into the light emitting layer, causing an electric current to flow in portions at which the layer on the light emitting layer and the layer under the light emitting layer are in electrical contact.

According to the present invention, there is provided a method of repairing a light-emitting device, characterized in that there is the electrical current flowing in portions at which the layer on the light emitting layer and the layer under the light emitting layer are in electrical contact, causing heat to be emitted, and making the portions that emit heat into higher resistance portions, or insulating portions.

According to the present invention, there is provided a method of repairing a light-emitting device, characterized in that the concentration of at least one of Li and Na contained in the cathode is equal to or less than $1 \times 10^{18}$ atoms/cm$^3$.

According to the present invention, there is provided a method of repairing a light-emitting device, characterized in that the amount of Mg contained in the cathode is equal to or more than $1 \times 10^{20}$ atoms/cm$^3$.

According to the present invention, there is provided a method of repairing a light-emitting device, characterized in that the reverse bias voltage is applied during fixed periods of time.

According to the present invention, there is provided a method of repairing a light-emitting device, characterized in that the reverse bias voltage is gradually increased during the application until it settles within ±15% of the height at which an avalanche current begins to flow within the organic compound layer.

According to the present invention, there is provided a method of repairing a light-emitting device, characterized in that the organic light emitting elements are arranged in a matrix shape, and a thin film transistor is connected to each of the organic light emitting elements.

According to the present invention, there is provided a method of manufacturing a light-emitting device containing an organic light emitting element having an anode, a cathode, and an organic compound layer sandwiched between the anode and the cathode, characterized by comprising:

forming the cathode such that the concentration of at least one of Li and Na contained in the cathode is equal to or less than $1 \times 10^{18}$ atoms/cm$^3$; and then applying a reverse bias voltage between the anode and the cathode.

According to the present invention, there is provided a method of manufacturing a light-emitting device containing an organic light emitting element having an anode, a cathode, and an organic compound layer sandwiched between the anode and the cathode, characterized by comprising:

forming the cathode such that the concentration of at least one of Li and Na contained in the cathode is equal to or less than $1\times10^{18}$ atoms/cm$^3$; and then applying a reverse bias voltage between the anode and the cathode, thus making an electric current flow in portions at which the anode and the cathode are electrically short-circuited, causing the short-circuited portions to emit heat, and making the portions that emit heat into higher resistance portions, or insulating portions.

According to the present invention, there is provided a method of manufacturing a light-emitting device containing an organic light emitting element having an anode, a cathode, and an organic compound layer sandwiched between the anode and the cathode, characterizing by comprising:

forming the cathode from an alloy containing Mg and at least one of Al and Ag; and then applying a reverse bias voltage between the anode and the cathode.

According to the present invention, there is provided a method of manufacturing a light-emitting device containing an organic light emitting element having an anode, a cathode, and an organic compound layer sandwiched between the anode and the cathode, characterizing by comprising:

forming the cathode from an alloy containing Mg and at least one of Al and Ag; and then applying a reverse bias voltage between the anode and the cathode, thus making an electric current flow in portions at which the anode and the cathode are electrically short-circuited, causing the short-circuited portions to emit heat, and making the portions that emit heat into higher resistance portions, or insulating portions.

BRIEF DESCRIPTION OF THE DRAWINGS

In the accompanying drawings:

FIG. 19 is a diagram showing a MOS structure in which AlLi is used as an electrode, and the capacitance-voltage characteristics of the MOS structure.

DETAILED DESCRIPTION OF THE PREFERRED EMBODIMENTS

Embodiment Mode

Figure 1A:
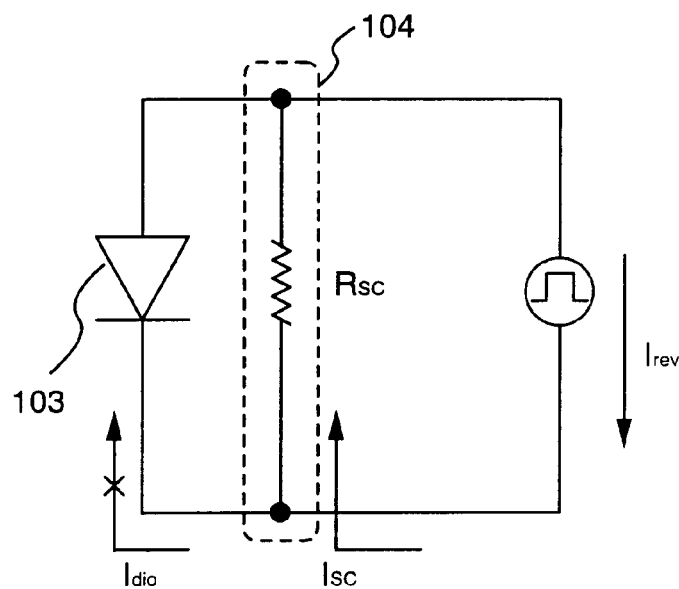
FIGS. 1A and 1B are diagrams schematically showing electric current flowing in an organic light emitting element when a reverse bias voltage is applied to the organic light emitting element.
Figure 1B:
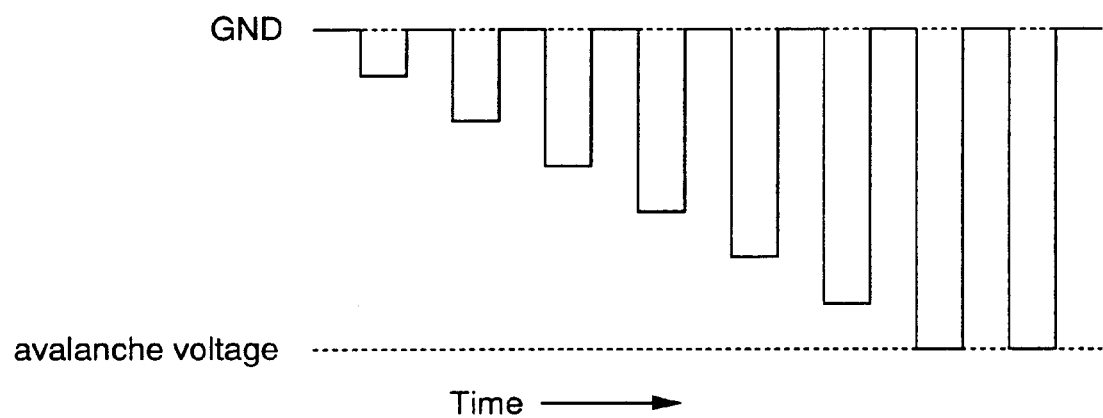

A repairing method of the present invention is explained using FIGS. 1A and 1B. FIG. 1A is a diagram that schematically shows the flow of electric current when a reverse bias voltage is applied to an organic light emitting element having a defect portion.

A ground voltage GND and a reverse bias voltage $V_{rev}$ are alternately applied to the organic light emitting element. A timing chart for the alternate application of the ground voltage GND and the reverse bias voltage $V_{rev}$ is shown in FIG. 1B. Note that, although the ground voltage GND and the reverse bias voltage $V_{rev}$ are applied alternately in the embodiment mode, the present invention is not limited to this structure. Other structures may also be used provided that a reverse bias electric current is made to flow in the organic light emitting element. A forward bias voltage and the reverse bias voltage $V_{rev}$ may therefore also be applied alternately to the organic light emitting element.

Further, although the reverse bias voltage is applied to the organic light emitting element for fixed time periods in the embodiment mode, the present invention is not limited by this. A direct current (DC) reverse bias voltage may also be applied to the organic light emitting element.

The reverse bias voltage is gradually increased in the embodiment mode until the avalanche phenomenon occurs, and an avalanche current flows in the organic light emitting element. The voltage at which the avalanche current begins to flow in the organic light emitting element is referred to as an avalanche voltage in this specification. However, the present invention is not limited to this structure. It is possible for a designer to suitably determine the size of the voltage applied to the organic light emitting element. The size of the voltage applied to the organic light emitting element may be one capable of causing the defect portion to be denatured, and one at which damage to the organic light emitting element and degradation of an organic compound layer do not occur.

Further, a structure in which a DC reverse bias voltage is gradually increased may also be used.

In addition, a constant reverse bias voltage may also be applied to the organic light emitting element for fixed periods of time, and may be applied by DC.

It is possible to prevent degradation if the reverse bias voltage is applied to the organic light emitting element for fixed periods of time resulting from the generation of heat in the organic compound layer in the vicinity of the defect portion due to the applied reverse bias voltage.

Further, by gradually increasing the size of the reverse bias voltage, it becomes easy to identify an optimal height of the reverse bias voltage for repairing the organic light emitting element.

If the reverse bias voltage $V_{rev}$ is applied to the organic light emitting element, then a reverse bias electric current $I_{rev}$ will flow. The reverse bias electric current $I_{rev}$ satisfies the equation $I_{rev}=I_{dio}+I_{SC}$, where $I_{dio}$ is the electric current flowing in an organic compound layer 103, and $I_{SC}$ is the electric current flowing in a defect portion 104. Note that there is almost no current flowing in the organic compound layer, and therefore the reverse bias electric current $I_{rev} \approx I_{SC}$.

The temperature of the defect portion 104 increases if the electric current $I_{rev}$ flows in the defect portion 104, and therefore the defect portion burns out, is gasified and vaporizes, or is oxidized or carbonized and becomes an insulator, thus becoming a denatured layer. A resistance $R_{SC}$ therefore becomes larger.

Figure 2A:
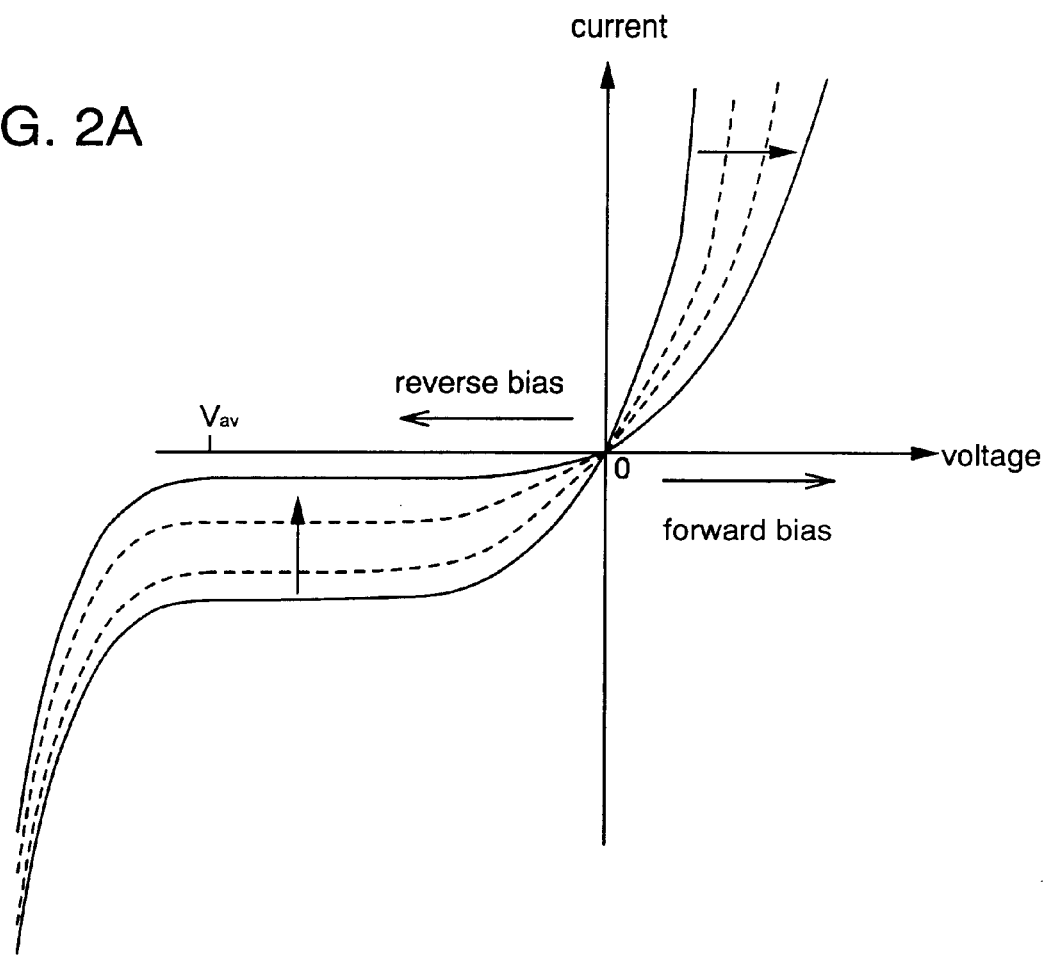
FIGS. 2A and 2B are diagrams schematically showing changes in the voltage-current characteristics of an organic light emitting element during repair processing, and showing electric current flowing in the organic light emitting element when a forward bias is applied to the organic light emitting element after repair, respectively.

Changes in the voltage-current characteristics of an organic light emitting element having the defect portion 104 are shown in FIG. 2A over time when using the repairing method of the present invention. The graph of the voltage-current characteristics changes in the direction shown by the arrows in the figure over time. Note that $V_{av}$ denotes an avalanche voltage. The electric current flowing in the organic light emitting element when the reverse bias voltage is applied becomes smaller as time passes, and therefore the electric current $I_{SC}$ flowing in the defect portion becomes less along with an increase in the resistance $R_{SC}$ of the defect portion.

Figure 2B:
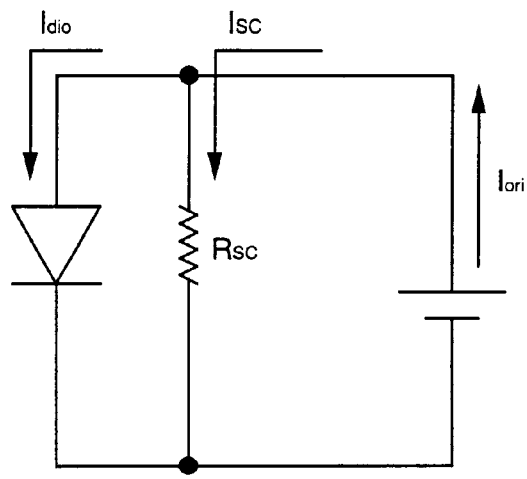

The flow of electric current when a forward bias voltage is applied to the organic light emitting element is shown schematically in FIG. 2B. If the electric current $I_{SC}$ flowing in the defect portion becomes smaller, then in practice the electric current $I_{dio}$ flowing in the organic compound layer becomes larger, and the brightness of light emission becomes higher, when the forward bias voltage is applied to the organic light emitting element.

Note that the organic light emitting element has a structure in which the organic compound layer is sandwiched between an anode and a cathode. Known materials may be freely used for the anode and the organic compound layer. However, it is necessary to be careful such that the high mobility components, for example, Na and Li, are not mixed into the cathode in the present invention. If the amount of Li and Na contained in the cathode exceeds $1\times10^{18}$ atoms/cm$^3$, then Li and Na diffuse and impart an influence on TFT performance. Problems such as degradation or instability in the TFT characteristics become very evident. It is therefore necessary that the amounts of Na and Li contained in the cathode are each kept equal to or less than $1\times10^{18}$ atoms/cm$^3$.

An alloy containing low work function magnesium is used for the cathode in the present invention. It is preferable, for example, to use alloys such as AlMg and MgAg. The amount of Mg contained in the cathode can be freely determined while considering the work function of the cathode. However, if the amount of Mg contained in the cathode is less than $1\times10^{20}$ atoms/cm$^3$, then the work function becomes high, and the efficiency of light emission falls. Consequently, it is preferable that the amount of Mg contained in the cathode be at least equal to, or greater than, $1\times10^{20}$ atoms/cm$^3$.

Even if pinholes are formed due to the influence of refuse or the like during film formation of an organic compound layer, therefore forming short circuits between two layers formed sandwiching a light emitting layer, use of the method of the present invention can change the short-circuited defect portion into a denatured portion, increasing its resistance. In addition, the actual amount of electric current flowing in the organic compound layer when a forward bias voltage is applied to the organic light emitting element can be increased. The brightness of light emission can therefore be increased when the same voltage is applied, even if a defect portion exists, in accordance with the repairing method of the present invention.

Furthermore, an electric current always flows in the defect portion, and degradation of the organic compound layer existing in the vicinity of the defect portion is easily promoted. However, the denatured layer has a high resistance $R_{SC}$. It thus becomes more difficult for current to flow, and promotion of degradation of the organic compound layer existing in the vicinity of the denatured layer can be prevented.

Further, the cathode of the organic light emitting element has the low diffusion elements Mg, Al, and Ag as its main constituents, and it therefore becomes possible to prevent device contamination accompanying application of the reverse bias voltage.

Embodiments

Embodiments of the present invention are explained below.

[Embodiment 1]

An example of using the repairing method of the present invention in an active matrix type light-emitting device having two thin film transistors (TFTs) in every pixel is explained in Embodiment 1.

Figure 3:
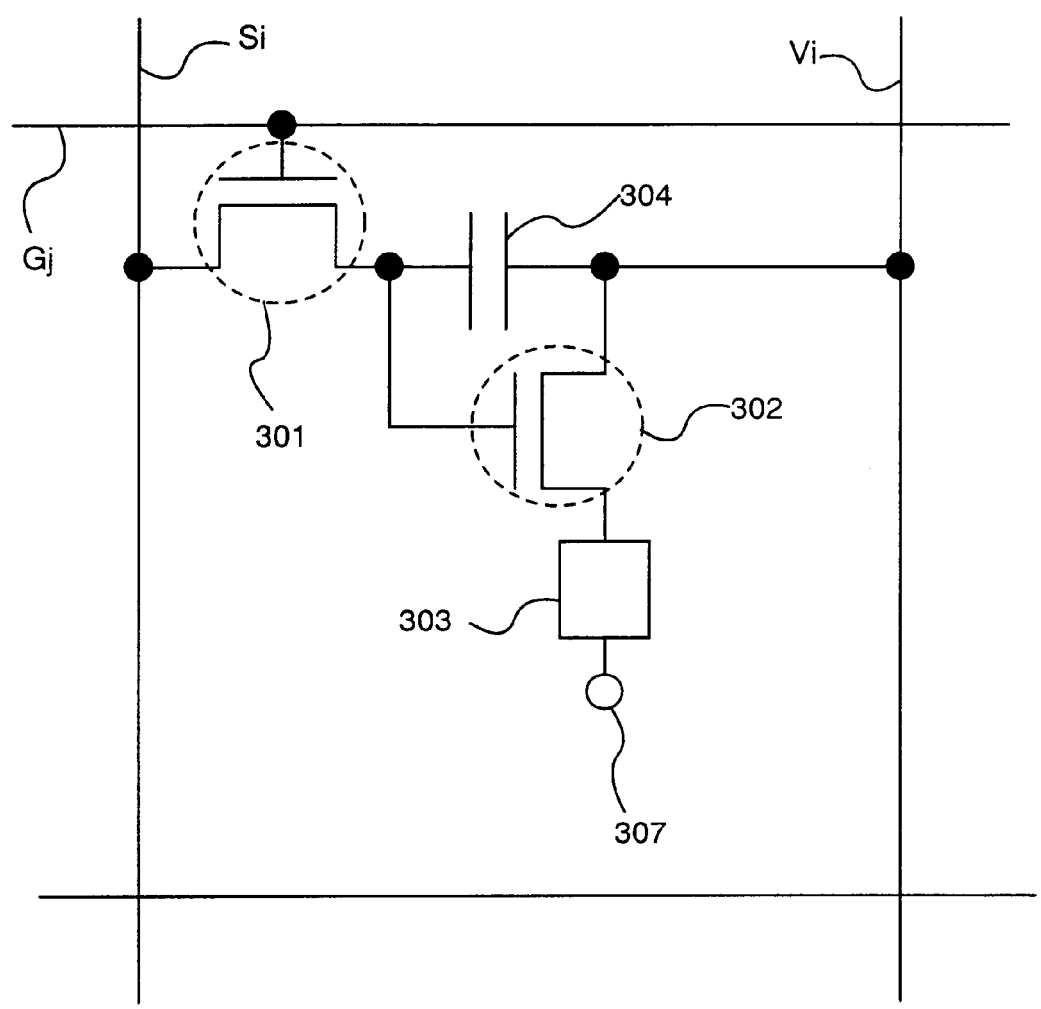
FIG. 3 is a circuit diagram of a pixel of Embodiment 1.

FIG. 3 shows a circuit diagram of a pixel of a light-emitting device using the repairing method of the present invention. Each pixel has a source signal line Si (where i is an integer from 1 to x), an electric power source supply line Vi (where i is an integer from 1 to x), and a gate signal line Gj (where j is an integer from 1 to y).

Further, each pixel has a switching TFT 301, a driver TFT 302, an organic light emitting element 303, and a capacitor 304.

A gate electrode of the switching TFT 301 is connected to the gate signal line Gi. Further, one of a source region and a drain region of the switching TFT 301 is connected to the source signal line Si, and the other one is connected to a gate electrode of the driver TFT 302.

A source region of the driver TFT 302 is connected to the electric power source supply line Vi, and a drain region of the driver TFT 302 is connected to one of two electrodes on the organic light emitting element 303. Among the two electrodes of the organic light emitting element 303, the electrode not connected to the drain region of the driver TFT 302 is connected to an opposing electric power source 307.

Note that, of the two organic light emitting element 303 electrodes, the one connected to the drain region of the driver TFT 302 is referred to as a pixel electrode, and the one connected to the opposing electric power source 307 is referred to as an opposing electrode.

The capacitor 304 is formed between the gate electrode of the driver TFT 302 and the electric power source supply line Vi.

Figure 4A:
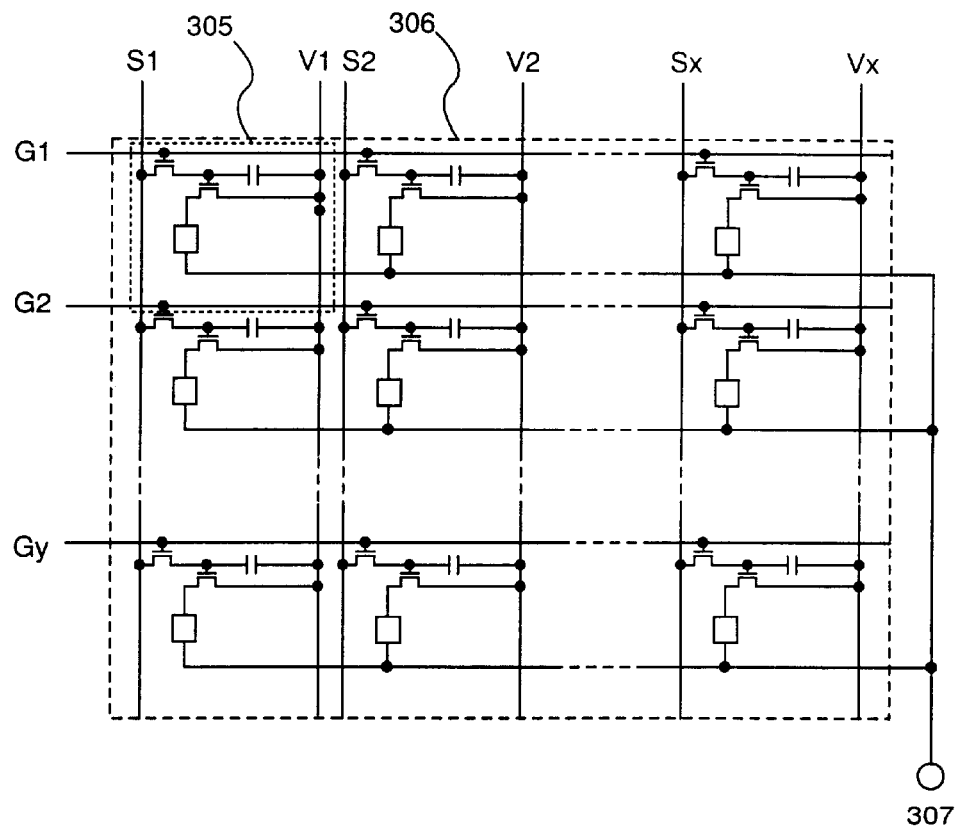
FIGS. 4A and 4B are diagrams showing a circuit diagram of a pixel portion of Embodiment 1, and operation of the pixel portion during repair, respectively.

A pixel portion of a light-emitting device having a plurality of the pixels of FIG. 3 is shown in FIG. 4A. The pixel portion 306 has the source signal lines S1 to Sx, the electric power source supply lines V1 to Vx, and the gate signal lines G1 to Gy. A plurality of the pixels 305 are formed in a matrix shape in the pixel portion 306.

Figure 4B:
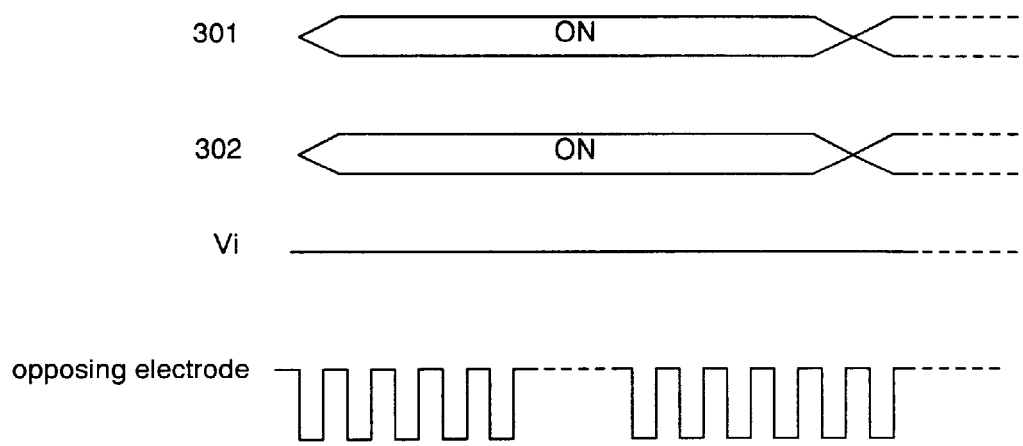

TFT operation in each pixel when repairing defect portions in the organic light emitting elements 303, and the size of the voltage input to the electric power source supply line Vi and the opposing electrode are shown in FIG. 4B. The switching TFTs 301 and the driver TFTs 302 of each pixel are both placed in an on state when repairing the defect portions in the organic light emitting elements 303. A predetermined reverse bias electric current flows in the organic light emitting elements at fixed intervals of time by fixing the voltage of the electric power source supply line Vi and changing the opposing electrode voltage at the fixed periods of time.

Repair of defects in the organic light emitting elements may be performed once for all of the pixels 305 in the pixel portion 306, may be performed line by line for single lines of pixels, or may be performed for each pixel individually.

Of the two electrodes on the organic light emitting elements in Embodiment 1, the cathode is formed using an alloy containing magnesium, alloys such as AlMg and MgAg, for example. Na and Li, high mobility components, are kept from being mixed into the cathode, and the amounts of Na and Li contained in the cathode are both set to equal to or less than $1 \times 10^{18}$ atoms/cm$^3$.

In accordance with the circuit of Embodiment 1, the reverse bias can be applied to the organic light emitting elements by suitably regulating the voltages applied to the switching TFT, the driver TFT, the electric power source supply line, and the opposing electric power source. The reverse bias can be applied without device contamination because processing is strictly managed so that Li and Na are not contained in the organic light emitting element cathodes.

[Embodiment 2]

An example of using the repairing method of the present invention in an active matrix type light-emitting device having three thin film transistors (TFTs) in every pixel is explained in Embodiment 2.

Figure 5:
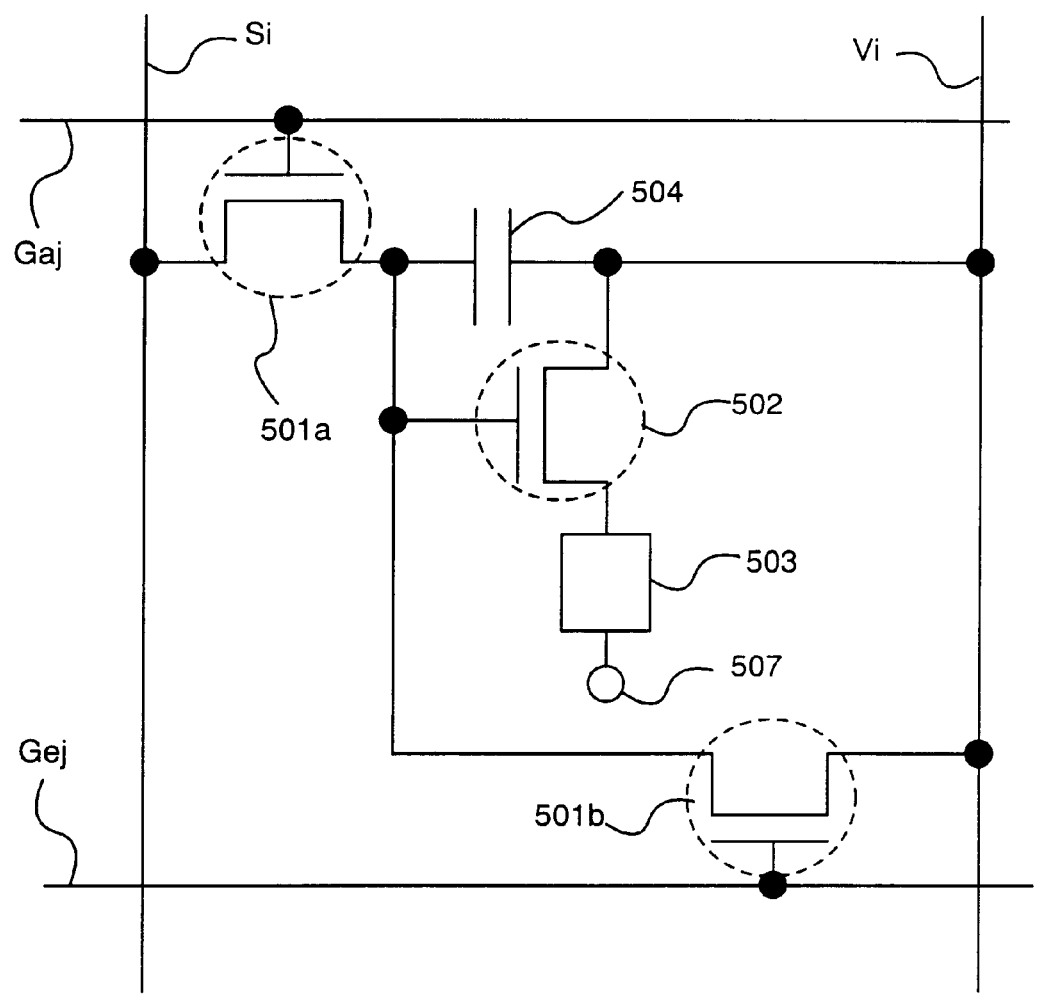
FIG. 5 is a circuit diagram of a pixel of Embodiment 2.

FIG. 5 shows a circuit diagram of a pixel of a light emitting element using the repairing method of the present invention. Each pixel has a source signal line Si (where i is an integer from 1 to x), an electric power source supply line Vi (where i is an integer from 1 to x), a write in gate signal line Gaj (where j is an integer from 1 to y), and an erasure gate signal line Gej (where j is an integer from 1 to y).

Further, each pixel has a switching TFT 501a, an erasure TFT 501b, a driver TFT 502, an organic light emitting element 503, and a capacitor 504.

A gate electrode of the switching TFT 501a is connected to the write in gate signal line Gaj. Further, one of a source region and a drain region of the switching TFT 501a is connected to the source signal line Si, and the other one is connected to a gate electrode of the driver TFT 502.

A gate electrode of the erasure TFT 501b is connected to the erasure gate signal line Gej. Further, one of a source region and a drain region of the erasure TFT 501b is connected to the electric power source supply line Vi, and the other one is connected to a gate electrode of the driver TFT 502.

A source region of the driver TFT 502 is connected to the electric power source supply line Vi, and a drain region of the driver TFT 502 is connected to one of two electrodes on the organic light emitting element 503. Of the two electrodes on the organic light emitting element 503, the one not connected to the drain region of the driver TFT 502 is connected to an opposing electric power source 507.

Note that, of the two electrodes on the organic light emitting element 503, the electrode connected to the drain region of the driver TFT 502 is referred to as a pixel electrode, and the electrode connected to the opposing electric power source 507 is referred to as an opposing electrode.

Further, the capacitor 504 is formed between the gate electrode of the driver TFT 502 and the electric power source supply line Vi.

Figure 6A:
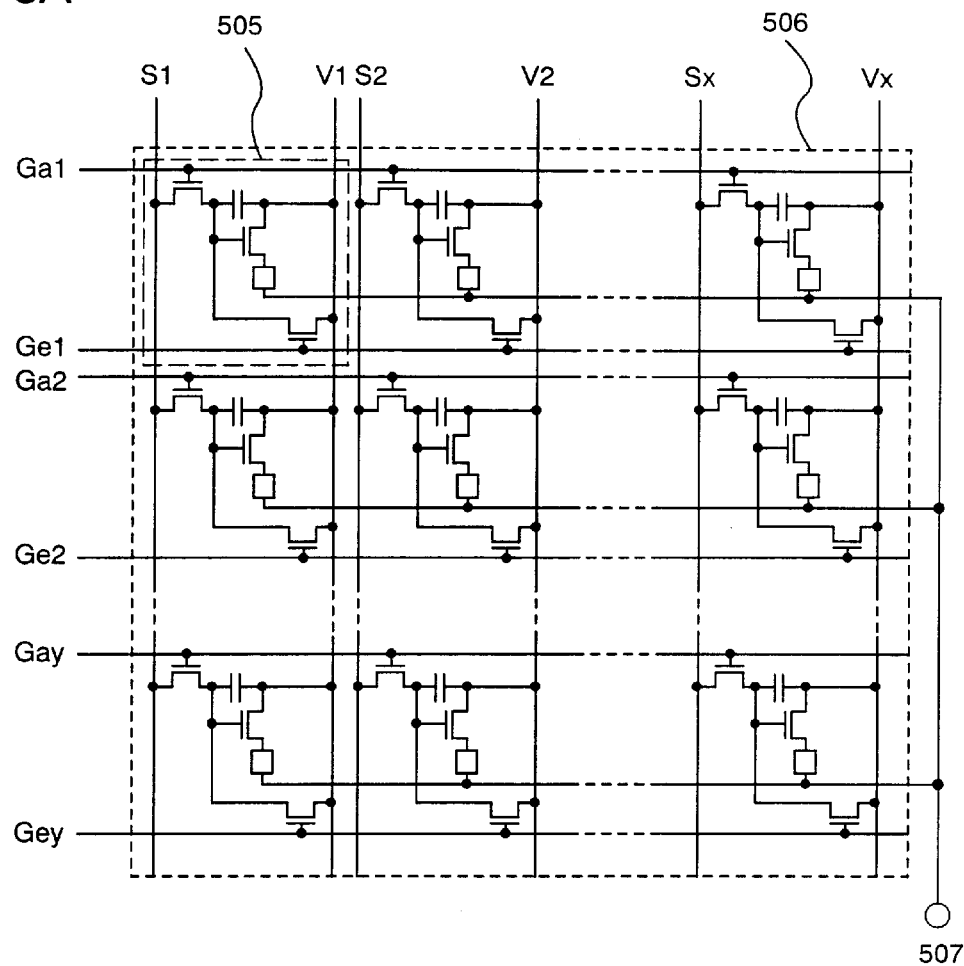
FIGS. 6A and 6B are diagrams showing a circuit diagram of a pixel portion of Embodiment 2, and operation of the pixel portion during repair, respectively.

A pixel portion of a light-emitting device having a plurality of the pixels of FIG. 5 is shown in FIG. 6A. The pixel portion 506 has the source signal lines S1 to Sx, the electric power source supply lines V1 to Vx, the write in gate signal lines Ga1 to Gay, and the erasure gate signal lines Ge1 to Gey. A plurality of the pixels 505 are formed in a matrix shape in the pixel portion 506.

Figure 6B:
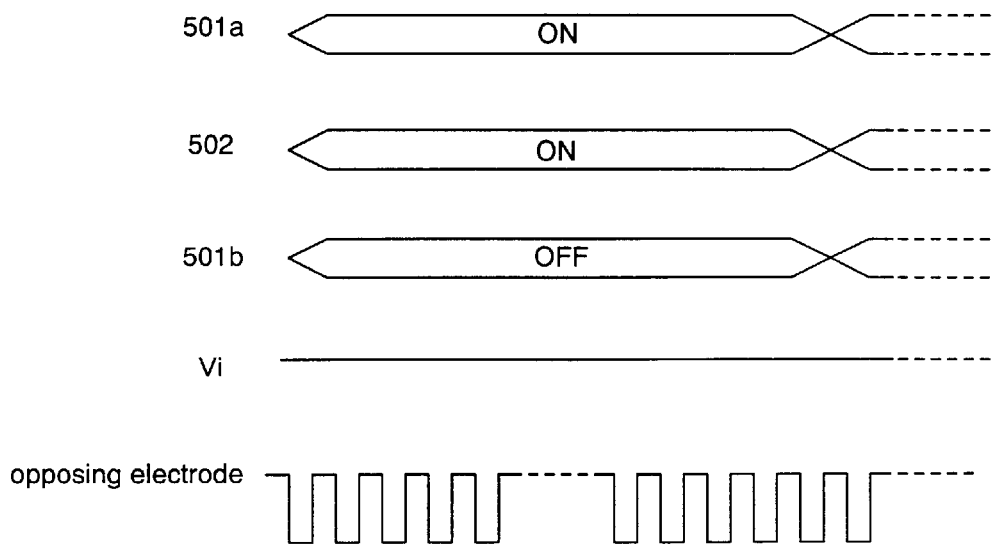

TFT operation in each pixel when repairing defect portions in the organic light emitting elements 503, and the size of the voltage input to the electric power source supply line Vi and the opposing electrode are shown in FIG. 6B. The switching TFTs 501a and the driver TFTs 502 of each pixel are both placed in an on state when repairing the defect portions in the organic light emitting elements 503. Further, the erasure TFT 501b of each pixel is placed in an off state. A predetermined reverse bias electric current flows in the organic light emitting elements 503 at fixed intervals of time by fixing the voltage of the electric power source supply line Vi and changing the opposing electrode voltage at the fixed periods of time.

Repair of defects in the organic light emitting elements 503 may be performed once for all of the pixels 505 in the pixel portion 506, may be performed line by line for single lines of pixels, or may be performed for each pixel individually.

Note that the cathodes of the organic light emitting elements are formed using an alloy containing magnesium, alloys such as AlMg and MgAg, for example, so that alkaline elements do not elute when the reverse bias is applied. Na and Li, high mobility components, are kept from being mixed into the cathode, and the amounts of Na and Li contained in the cathode are both set to equal to or less than $1 \times 10^{18}$ atoms/cm$^3$.

In accordance with the circuit of Embodiment 2, the reverse bias can also be applied to the organic light emitting elements.

[Embodiment 3]

An example of using the repairing method of the present invention in an active matrix type light-emitting device having three thin film transistors (TFTs) in every pixel is explained in Embodiment 3.

Figure 7:
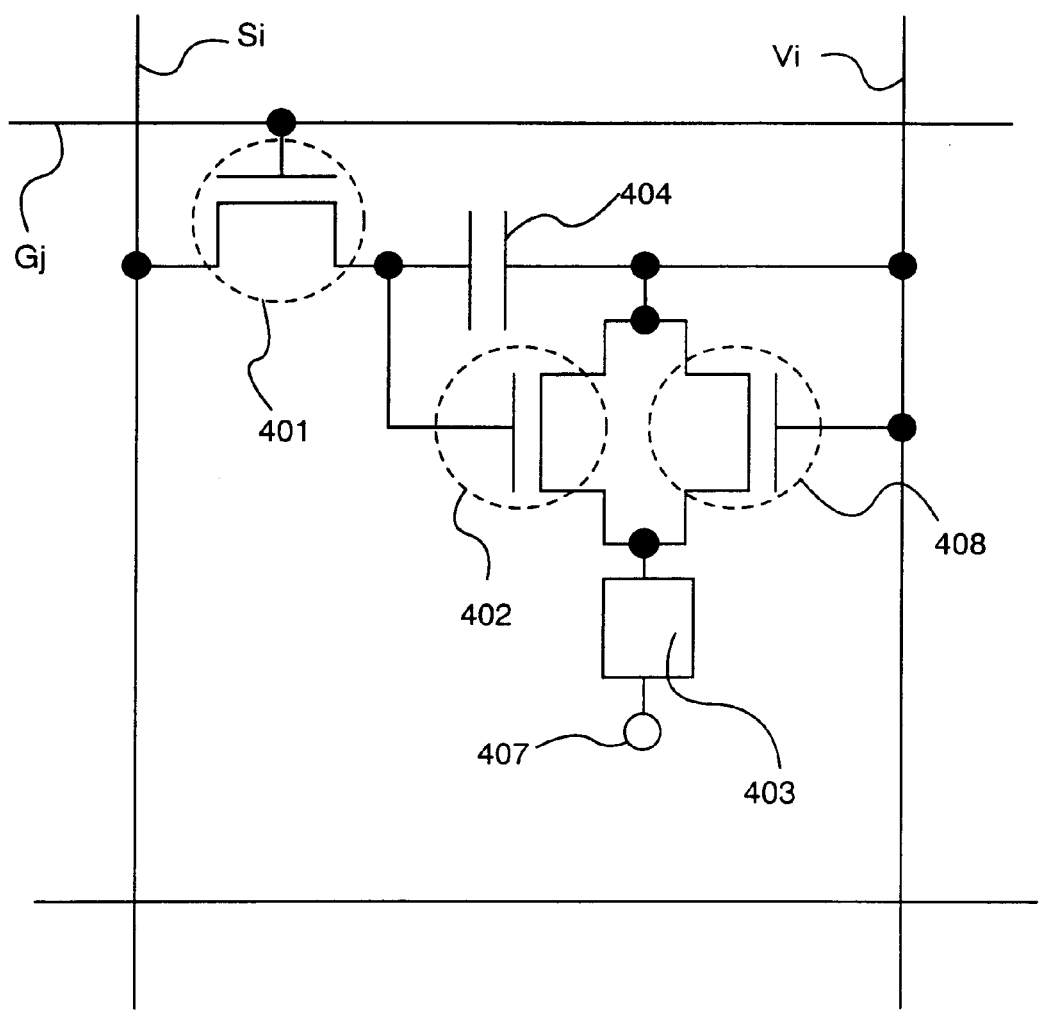
FIG. 7 is a circuit diagram of a pixel of Embodiment 3.

FIG. 7 shows a circuit diagram of a pixel of a light-emitting device using the repairing method of the present invention. Each pixel has a source signal line Si (where i is an integer from 1 to x), an electric power source supply line Vi (where i is an integer from 1 to x), and a gate signal line Gj (where j is an integer from 1 to y).

Further, each pixel has a switching TFT 401, a driver TFT 402, an organic light emitting element 403, a capacitor 404, and a reverse bias application TFT 408.

A gate electrode of the switching TFT 401 is connected to the gate signal line Gi. Further, one of a source region and a drain region of the switching TFT 401 is connected to the source signal line Si, and the other one is connected to a gate electrode of the driver TFT 402.

A source region of the driver TFT 402 is connected to the electric power source supply line Vi, and a drain region of the driver TFT 402 is connected to one of two electrodes on the organic light emitting element 403. Among the two electrodes of the organic light emitting element 403, the electrode not connected to the drain region of the driver TFT 402 is connected to an opposing electric power source 407.

Note that, of the two organic light emitting element 403 electrodes, the one connected to the drain region of the driver TFT 402 is referred to as a pixel electrode, and the one connected to the opposing electric power source 407 is referred to as an opposing electrode.

A gate electrode of the reverse bias application TFT 408 is connected to the electric power source supply line Vi. Further, one of a source region and a drain region of the reverse bias application TFT 408 is connected to the electric power source supply line Vi, and the other one is connected to the pixel electrode of the organic light emitting element.

The capacitor 404 is formed between the gate electrode of the driver TFT 402 and the electric power source supply line Vi.

Figure 8A:
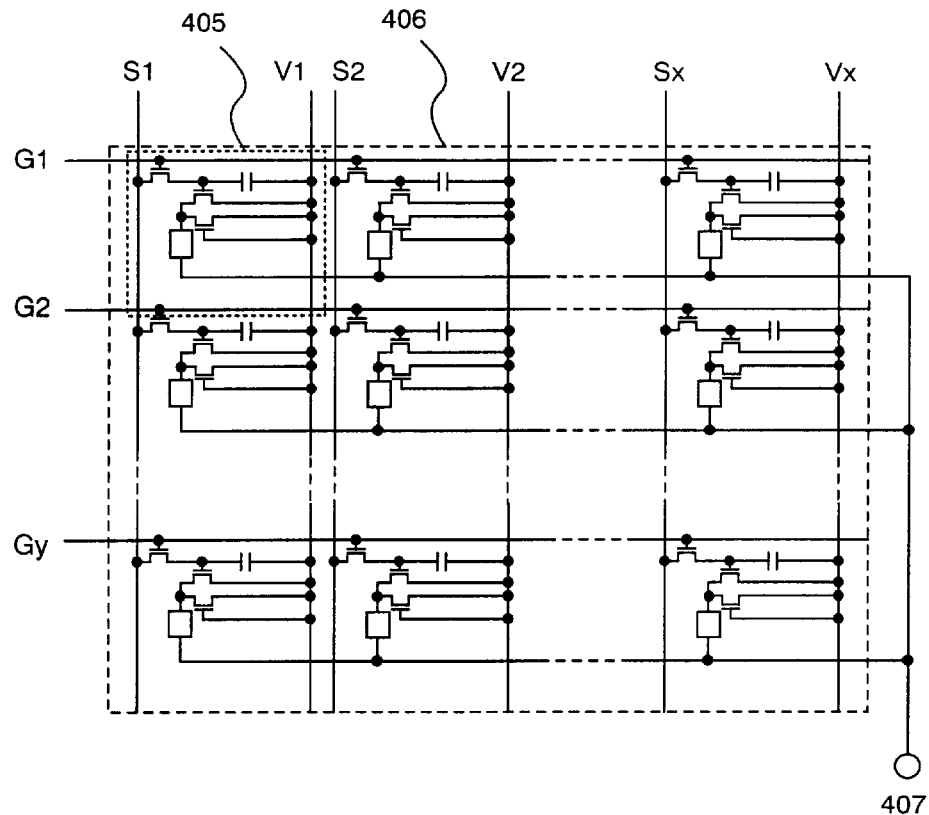
FIGS. 8A and 8B are diagrams showing a circuit diagram of a pixel portion of Embodiment 3, and operation of the pixel portion during repair, respectively.

A pixel portion of a light-emitting device having a plurality of the pixels of FIG. 7 is shown in FIG. 8A. The pixel portion 406 has the source signal lines S1 to Sx, the electric power source supply lines V1 to Vx, and the gate signal lines G1 to Gy. A plurality of the pixels 405 are formed in a matrix shape in the pixel portion 406.

Figure 8B:
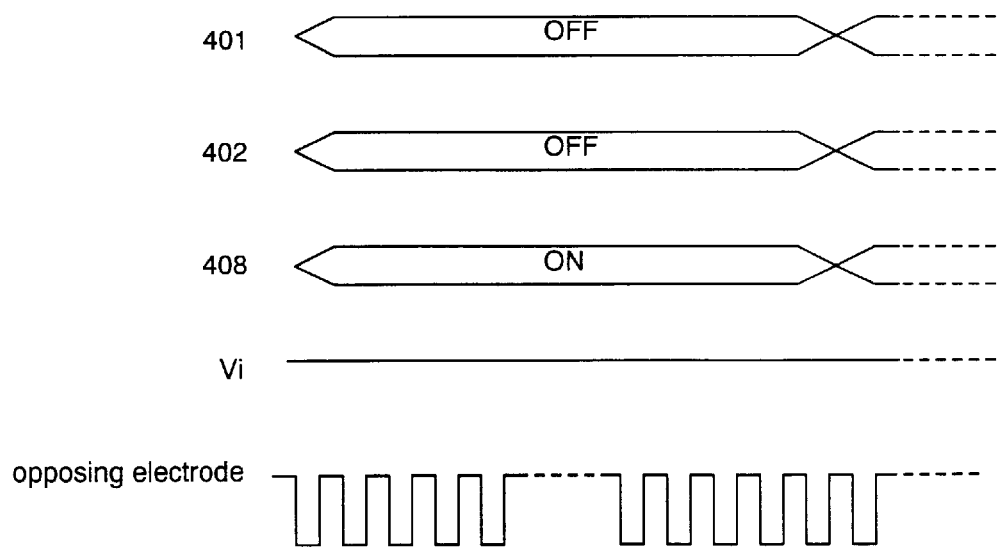

TFT operation in each pixel when repairing defect portions in the organic light emitting elements 403, and the size of the voltage input to the electric power source supply line Vi and the opposing electrode are shown in FIG. 8B. The switching TFTs 401 and the driver TFTs 402 of each pixel are both placed in an off state when repairing the defect portions in the organic light emitting elements 403. A forward direction voltage is then applied by placing the reverse bias application TFTs 408, which have rectification characteristics, in an on state. An electric current flows in the reverse bias TFTs by doing so, and a reverse bias is applied to the organic light emitting elements. A predetermined reverse bias electric current flows in the organic light emitting elements at fixed intervals of time by fixing the voltage of the electric power source supply line Vi and changing the opposing electrode voltage at the fixed periods of time.

Repair of defects in the organic light emitting elements may be performed once for all of the pixels, or may be performed line by line for single lines of pixels.

Note that the cathodes of the organic light emitting elements are formed using an alloy containing magnesium, alloys such as AlMg and MgAg, for example, so that alkaline elements do not elute when the reverse bias is applied. Na and Li, high mobility components, are kept from being mixed into the cathode, and the amounts of Na and Li contained in the cathode are both set to equal to or less than $1\times10^{18}$ atoms/cm$^3$.

The circuit of Embodiment 3 can easily apply a reverse bias to the organic light emitting elements by adjusting the electric potential of the electric power source supply line and the electric potential of the opposing electric power source.

[Embodiment 4]

This embodiment describes a case of applying a repairing method of the present invention to an organic light emitting element whose organic compound layer comprises a plurality of layers.

Figure 9A:
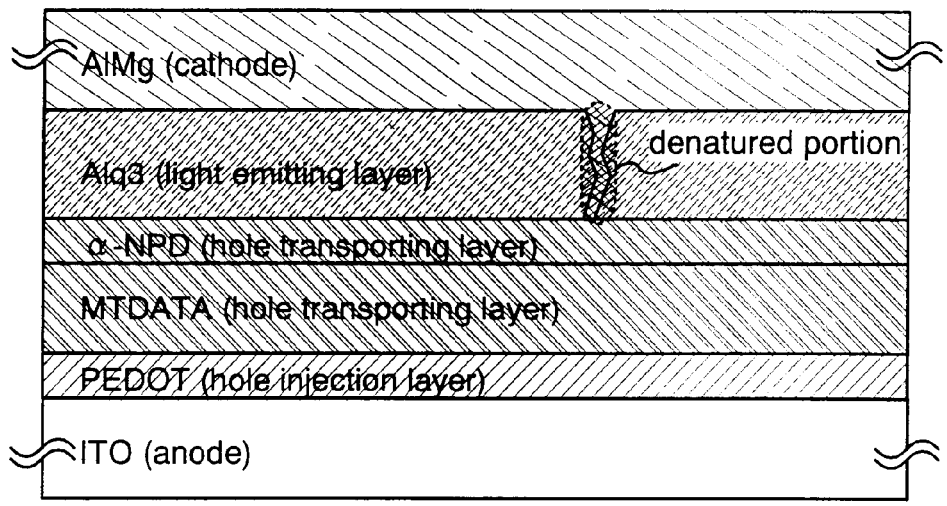
FIGS. 9A and 9B are diagrams showing the structure of organic light emitting elements of Embodiment 4.

FIG. 9A shows the structure of the organic light emitting element. First, a hole injection layer is formed by spin coating to a thickness of 30 nm from PEDOT that is a polythiophene derivative on an anode formed from a compound of indium oxide and tin oxide (ITO). Next, an MTDATA layer with a thickness of 20 nm and an α-NPD layer with a thickness of 10 nm are formed by evaporation as a hole transporting layer. On the hole transporting layer, a light emitting layer is formed from a luminous material, Alq$_3$, that is a singlet compound by evaporation to a thickness of 50 nm. Then a cathode is formed by depositing AlMg through evaporation to a thickness of 100 nm to complete the organic light emitting element.

If a pin hole is opened and a defect portion is formed in the light emitting layer of the organic light emitting element structured as above, the AlMg that is the cathode is undesirably brought into contact with the α-NPD layer that is the hole transporting layer in the defect portion.

When a reverse bias current is caused to flow in the organic light emitting element having the defect portion at given time intervals, the temperature in the defect portion is raised so that the defect portion is burnt out, vaporized, or oxidized or carbonized to be transformed into an insulator. As a result, the defect portion is changed into the transmuted portion to increase the resistance thereof. Therefore degradation of a part of the organic compound layer that surrounds the transmuted portion is not accelerated.

Light emitted from this organic light emitting element utilizes singlet excitation energy from the singlet compound.

Figure 9B:
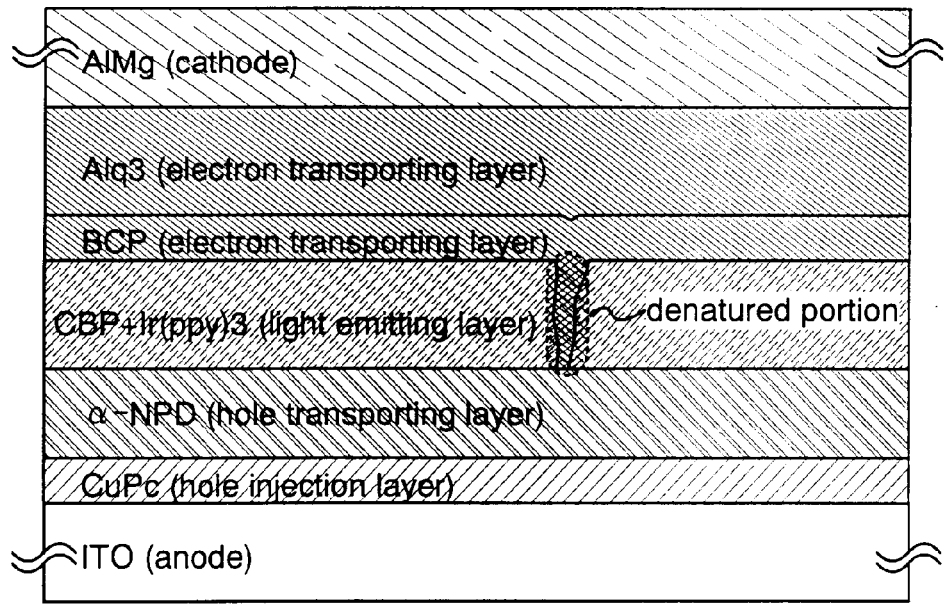

FIG. 9B shows the structure of another organic light emitting element. First, a hole injection layer is formed by evaporation to a thickness of 20 nm from copper phthalocyanine on an anode formed from a compound of indium oxide and tin oxide. Next, a hole transporting layer is formed from α-NPD by evaporation to a thickness of 10 nm. On the hole transporting layer, a light emitting layer is formed from light emitting materials, Ir(ppy)$_3$ and CBP, that are triplet compounds by evaporation to a thickness of 20 nm. An electron transporting layer is formed on the light emitting layer by forming a BCP layer with a thickness of 10 nm and an Alq$_3$ layer with a thickness of 40 nm through evaporation. Then a cathode is formed by depositing AlMg through evaporation to a thickness of 100 nm to complete the organic light emitting element.

If a pin hole is opened and a defect portion is formed in the light emitting layer of the organic light emitting element structured as above, the BCP layer that is the electron transporting layer is undesirably brought into contact with the α-NPD layer that is the hole transporting layer in the defect portion.

When a reverse bias current is caused to flow in the organic light emitting element having the defect portion at given time intervals, the temperature in the defect portion is raised so that the defect portion is burnt out, vaporized, or oxidized or carbonized to be transformed into an insulator. As a result, the defect portion is changed into the transmuted portion to increase the resistance thereof. Therefore degradation of a part of the organic compound layer that surrounds the transmuted portion is not accelerated.

Light emitted from this organic light emitting element utilizes triplet excitation energy from the triplet compounds.

Figure 10A:
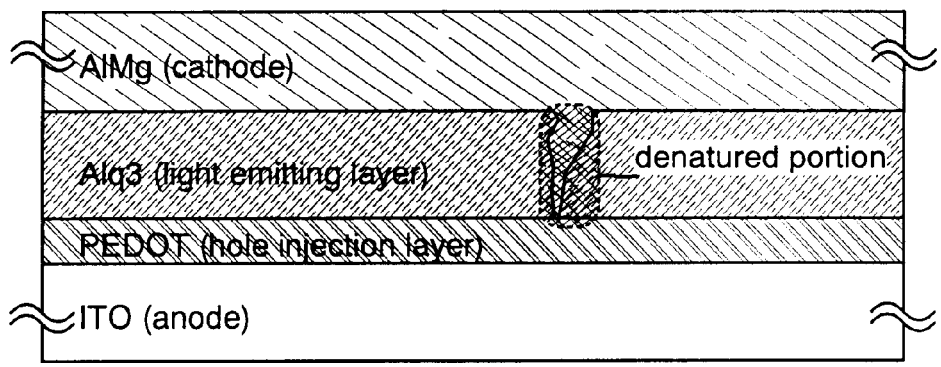
FIGS. 10A and 10B are diagrams showing the structure of organic light emitting elements of Embodiment 4.

FIG. 10A shows the structure of still another organic light emitting element. First, a hole injection layer is formed by spin coating to a thickness of 30 nm from PEDOT that is a polythiophene derivative on an anode formed from a compound of indium oxide and tin oxide (ITO). On the hole injection layer, a light emitting layer is formed from a light emitting material, $Alq_3$, that is a singlet compound by evaporation to a thickness of 50 nm. Then a cathode is formed by depositing AlMg through evaporation to a thickness of 100 nm to complete the light emitting element.

If a pin hole is opened and a defect portion is formed in the light emitting layer of the organic light emitting element structured as above, the AlMg that is the cathode is undesirably brought into contact with the PEDOT layer that is the hole injection layer in the defect portion.

When a reverse bias current is caused to flow in the organic light emitting element having the defect portion at given time intervals, the temperature in the defect portion is raised so that the defect portion is burnt out, vaporized, or oxidized or carbonized to be transformed into an insulator. As a result, the defect portion is changed into the transmuted portion to increase the resistance thereof. Therefore, degradation of a part of the organic compound layer that surrounds the transmuted portion is not accelerated.

Light emitted from this organic light emitting element utilizes singlet excitation energy from the singlet compound.

Figure 10B:
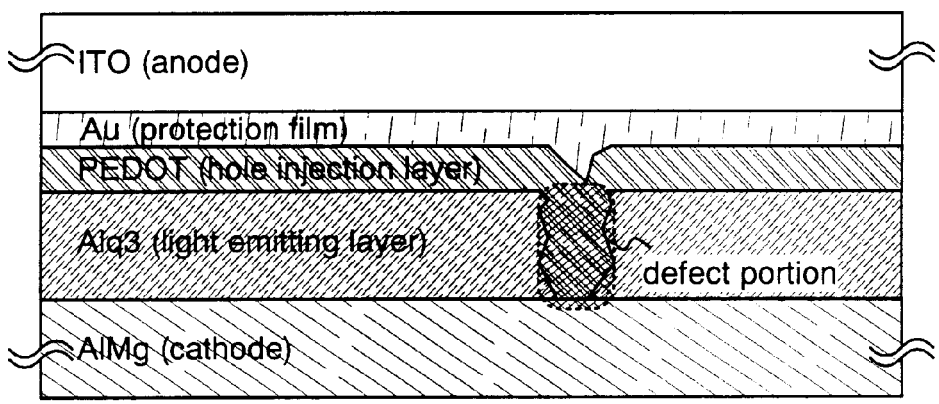

FIG. 10B shows the structure of yet still another organic light emitting element. First, a cathode is formed by evaporation from AlMg to a thickness of 100 nm. On the cathode, a light emitting layer is formed from a light emitting material, $Alq_3$, that is a singlet compound by evaporation to a thickness of 50 nm. Next, a hole injection layer is formed by spin coating to a thickness of 30 nm from PEDOT that is a polythiophene derivative. An Au film with a thickness of 5 nm is formed thereon. The Au film is provided to prevent degradation of a surface of the organic compound layer in later steps. Then an anode is formed on the Au film from a compound of indium oxide and tin oxide (ITO) to complete the organic light emitting element.

If a pin hole is opened and a defect portion is formed in the light emitting layer of the organic light emitting element structured as above, the AlMg that is the cathode is undesirably brought into contact with the PEDOT layer that is the hole injection layer in the defect portion.

Light emitted from this organic light emitting element utilizes singlet excitation energy from the singlet compound.

With the above structure, the present invention can increase the amount of current actually flowing through the organic compound layer upon application of a forward bias voltage to the organic light emitting element even if a pin hole is formed in the organic compound layer during formation of the layer due to dusts or the like and two layers sandwiching a light emitting layer short-circuit, because the method can raise the resistance of the defect portion where the short circuit takes place by changing the defect portion into the transmuted portion. Therefore the repairing method of the present invention can raise the luminance of emitted light with application of the same level of voltage despite the presence of the defect portion.

Furthermore, the invention can prevent accelerated degradation in a part of the organic compound layer that surrounds the defect portion by changing the defect portion into the transmuted portion to increase the resistance thereof.

A carbide generated by carbonization of a light emitting material is high in insulating property and is stable as a substance. For that reason, the repairing method of the present invention is particularly effective when an organic compound material is formed in lamination in the defect portion, for example, when the defect portion is formed in a light emitting layer ($Alq_3$), and the hole injection layer (PEDOT) is laminated in contact with the light emitting layer ($Alq_3$).

This embodiment may be combined freely with Embodiments 1 to 3.

[Embodiment 5]

In this embodiment, materials of a light emitting element by which phosphorescence from a triplet exciton can be employed for emitting a light. As a result, the power consumption of the organic light emitting element can be reduced, the lifetime of the organic light emitting element can be elongated and the weight of the organic light emitting element can be lightened.

The following is a report where the external light emitting quantum efficiency is improved by using the triplet exciton (T. Tsutsui, C. Adachi, S. Saito, Photochemical Processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical Formula 1)

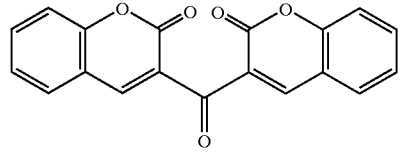

(M. A. Baldo, D. F. O'Brien, Y. You, A. Shoustikov, S. Sibley, M. E. Thompson, S. R. Forrest, Nature 395 (1998) p.151)

The molecular formula of an EL material (Pt complex) reported by the above article is represented as follows.

(Chemical Formula 2)

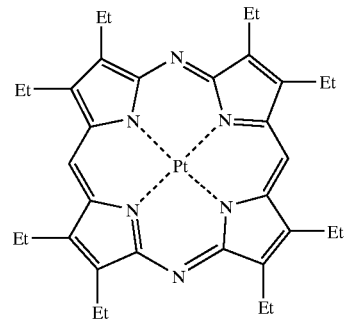

(M. A. Baldo, S. Lamansky, P. E. Burrows, M. E. Thompson, S. R. Forrest, Appl. Phys. Lett., 75 (1999) p.4.) (T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical Formula 3)

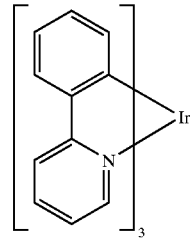

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of the Embodiments 1 to 4.

[Embodiment 6]

This embodiment gives descriptions on a sectional view of a light-emitting device to which a repairing method of the present invention is applied.

Figure 14:
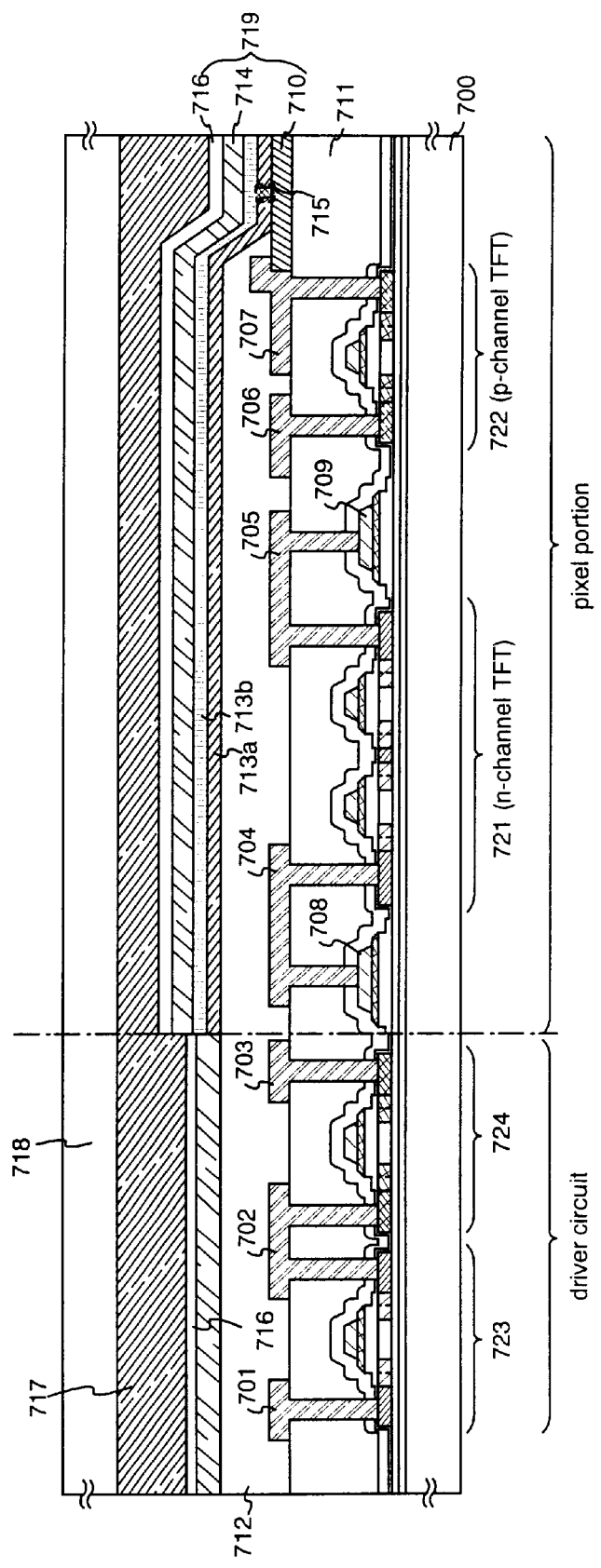
FIG. 14 is a cross sectional diagram of a light-emitting device of Embodiment 5.

In FIG. 14, an n-channel TFT 503 is formed by using a switching TFT 721 formed on a substrate 700.

The switching TFT 721 in this embodiment has a double gate structure in which two channel regions are formed. However, the TFT may take a single gate structure having one channel region or a triple gate structure having three channel regions.

A driving circuit formed on the substrate 700 has an n-channel TFT 723 and a p-channel TFT 724. Although the TFTs of the driving circuit are of single gate structure in this embodiment, the TFTs may take the double gate structure or the triple gate structure.

Wiring lines 701 and 703 function as source wiring lines of the CMOS circuit whereas 702 functions as a drain wiring line thereof. A wiring line 704 functions as a wiring line that electrically connects a source wiring line 708 to a source region of the switching TFT. A wiring line 705 functions as a wiring line that electrically connects a drain wiring line 709 to a drain region of the switching TFT.

A p-channel TFT is used for a driving TFT 722. The driving TFT 722 in this embodiment is of single gate structure but it may have the double gate structure or the triple gate structure.

A wiring line 706 is a source wiring line of the driving TFT (corresponds to a current supply line). A wiring line 707 is an electrode that is laid on a pixel electrode 710 of the driving TFT to be electrically connected to the pixel electrode 710.

The pixel electrode 710 is formed from a transparent conductive film and serves as an anode of an organic light emitting element. The transparent conductive film is obtained from a compound of indium oxide and tin oxide or a compound of indium oxide and zinc oxide, or from zinc oxide, tin oxide, or indium oxide alone. The transparent conductive film may be doped with gallium. The pixel electrode 710 is formed on a flat interlayer insulating film 711 before forming the above wiring lines. In this embodiment, the film 711 is a planarization film made of resin and it is very important to level the level differences caused by the TFTs with the planarization film 711. An organic compound layer to be formed later is so thin that the existence of level differences can cause light emission defect. Accordingly the surface has to be leveled before forming the pixel electrode so that the organic compound layer is formed on as flat a surface as possible.

After the wiring lines 701 to 707 are formed, a bank 712 is formed as shown in FIG. 14. The bank 712 is formed by patterning an insulating film containing silicon, or an organic resin film, which has a thickness of 100 to 400 nm.

An organic compound layer 713 is formed on the pixel electrode 710. Although only one pixel is shown in FIG. 14, formed in this embodiment are organic compound layers for red light (R), organic compound layers for green light (G), and organic compound layers for blue light (B). A low molecular weight organic compound layer is formed by evaporation in this embodiment. Specifically, a laminate structure is formed, in which a copper phthalocyanine (CuPc) film with a thickness of 20 nm is formed as a hole injection layer 713a and a tris-8-quinolinolate aluminum complex ($Alq_3$) film with a thickness of 70 nm is formed as a light emitting layer 713b on the hole injection layer. The color of emitted light can be controlled by choosing which fluorescent pigment, such as quinacridon, perylene, or DCM1, is used to dope $Alq_3$.

The material given in the above is merely an example of organic compound materials that can be used for the organic compound layer and there is no need to be limited thereto. The organic compound layer (meaning a layer for light emission and for carrier transportation to emit light) may have a charge carrier transporting layer or a charge carrier injection layer, or both, in addition to the light emitting layer. For instance, a high molecular weight organic compound material may be employed for the organic compound layer though used in the example shown in this embodiment is a low molecular weight organic compound material. Inorganic materials such as silicon carbide may be used for the charge carrier transporting layer and the charge carrier injection layer. Known organic materials and known inorganic materials can be used.

On the organic compound layer 713, a cathode 714 is formed from a conductive film. In this embodiment, an alloy film of aluminum and magnesium is used as the conductive film. A known MgAg film (an alloy film of magnesium and silver) may of course be used. An appropriate cathode material is a conductive film made of an element belonging to Group 2 in the periodic table, or a conductive film doped with a Group 2 element. For example, at least one element among these Be, Mg, Ca, Sr and Ba should be added.

When the cathode have two film laminated structure, magnesium is formed in contact with the organic compound layer, and aluminum is formed on the magnesium, the voltage starting emitting light of the organic light emitting layer can be lowered. It is preferable to form magnesium into 100 nm thickness and also aluminum into 100 nm thickness.

Formation of the cathode 714 completes an organic light emitting element 719. The organic light emitting element 719 here means a capacitor comprising the pixel electrode (anode) 710, the organic compound layer 713, and the cathode 714.

It is effective to provide a passivation film 716 so as to cover the organic light emitting element 719 completely. The passivation film 716 is an insulating film, examples of which include a carbon film, a silicon nitride film, and a silicon oxynitride film. A single layer or a laminate of these insulating films is used for the passivation film.

It is preferable to use as the passivation film a film that can cover a wide area. A carbon film, a DLC (diamond-like carbon) film, in particular, is effective. The DLC film can be formed in a temperature range between room temperature and 100° C., and therefore is easy to form above the organic compound layer 713 that has a low heat resistance. Furthermore, the DLC film is highly effective in blocking oxygen and can prevent oxidization of the organic compound layer 713. Therefore the organic compound layer 713 can be saved from being oxidized before a sealing step to be carried out subsequently.

A seal 717 is provided on the passivation film 716 (and a cover member 718 is bonded. A UV-curable resin can be used as the seal 717. It is effective to place a substance having a hygroscopic effect or a substance having an anti-oxidizing effect inside the seal 717. The cover member 718 used in this embodiment is a glass substrate, a quartz substrate, or a plastic substrate (including a plastic film) with carbon films (preferably diamond-like carbon films) formed on its front and back.

Thus completed is a light-emitting device structured as shown in FIG. 14. It is effective to use a multi-chamber type (or in-line type) film forming apparatus to successively process the steps subsequent to formation of the bank 712 up through formation of the passivation film 716 without exposing the device to the air. The successive processing for avoiding exposure to the air may further be extended to include the step of bonding the cover member 718.

The TFTs in this embodiment are each characterized in that: a gate electrode is formed from a conductive film having two layers; almost no difference in concentration is found between low concentration impurity regions that are formed between a channel region and a drain region, thereby forming a gentle concentration gradient; and the low concentration impurity regions are classified into one that overlaps with the underlying gate electrode (this one is called a GOLD region) and one that does not overlap the gate electrode (this one is called an LDD region). The edges of a gate insulating film, namely, a region above the region that does not overlap the gate electrode and above a high concentration impurity region are tapered.

In the light-emitting device of this embodiment, if there is a pin hole in the light emitting layer 713b, it causes a defect portion where the hole injection layer 713a and the cathode 714 are brought into contact through the pin hole. The defect portion can be changed into a transmuted portion 715 by the repairing method of the present invention, resulting in a raise in resistance. Therefore the other part of the pixel than the pin hole can have increased luminance and degradation of a part of the organic compound layer that surrounds the pin hole is not accelerated.

This embodiment shows the structure of the pixel portion and of the driving circuit only. However, the manufacturing process according to this embodiment can also form logic circuits such as a signal divider circuit, a D/A converter, an operation amplifier, and a y correction circuit on the same insulator which holds the pixel portion and the driving circuit. Additionally, a memory and a microprocessor may be formed.

The structure of this embodiment can be combined with any of Embodiments 1, 2, 3, and 8.

[Embodiment 7]

This embodiment gives descriptions on a sectional view of a light-emitting device to which a repairing method of the present invention is applied.

Figure 15:
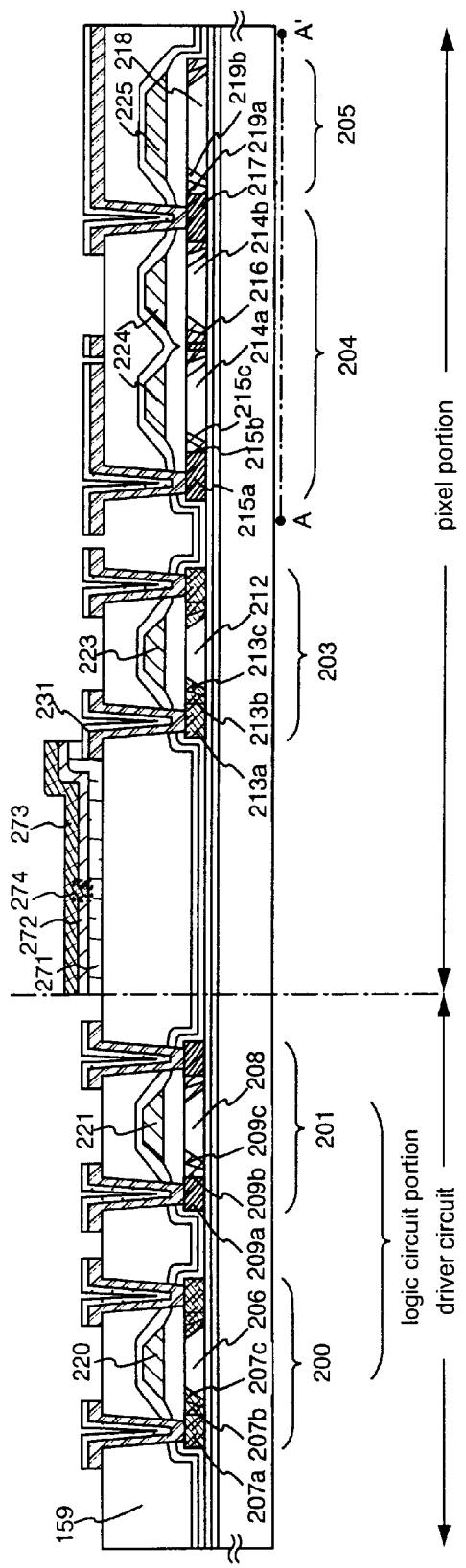
FIG. 15 is a cross sectional diagram of a light-emitting device of Embodiment 6.

In FIG. 15, an p-channel TFT 200 and an n-channel TFT 201 of a driving circuit are formed on the same substrate on which a driving TFT 203, a switching TFT 204, and a capacitor storage 205 are formed to constitute a pixel portion.

The p-channel TFT 200 of the driving circuit is comprised of: a conductive layer 220 having a second taper shape and functioning as a gate electrode; a channel region 206; a third impurity region 207a to function as a source region or a drain region; a fourth impurity region (A) 207b serving as an LDD region that does not overlap the gate electrode 220; and a fourth impurity region (B) 207c serving as an LDD region that partially overlaps the gate electrode 220.

The n-channel TFT 201 of the driving circuit is comprised of: a conductive layer 221 having a second taper shape and functioning as a gate electrode; a channel region 208; a first impurity region 209a to function as a source region or a drain region; a second impurity region (A) 209b serving as an LDD region that does not overlap the gate electrode 221; and a second impurity region (B) 209c serving as an LDD region that partially overlaps the gate electrode 221. While the channel length is 2 to 7 μm, the length of a portion where the second impurity region (B) 209c overlaps the gate electrode 221 is set to 0.1 to 0.3 μm. The length of this $L_{OV}$ region is controlled by adjusting the thickness of the gate electrode 221 and the angle of the tapered portion. With this LDD region formed in the n-channel TFT, the high electric field generated in the vicinity of the drain region is eased to prevent creation of hot carriers and thus prevent degradation of the TFT.

Similarly, the driving TFT 203 is comprised of: a conductive layer 223 having a second taper shape and functioning as a gate electrode; a channel region 212; a third impurity region 213a to function as a source region or a drain region; a fourth impurity region (A) 213b serving as an LDD region that does not overlap the gate electrode 223; and a fourth impurity region (B) 213c serving as an LDD region that partially overlaps the gate electrode 223.

Logic circuits such as a shift register circuit and a buffer circuit, and a sampling circuit having an analog switch constitute the driving circuit. In FIG. 15, the TFTs of these circuits have a single gate structure in which one gate electrode is placed between a source and a drain that form a pair. However, the TFTs may have a multi-gate structure in which a plurality of electrodes are placed between the source and the drain that form a pair.

The drain region of the driving TFT 203 is connected to a pixel electrode 271 through a wiring line 231 on an interlayer insulating film 159. An organic compound layer 272 is formed from a known organic compound material so as to contact with the pixel electrode 271. A cathode 273 is formed so as to contact with the organic compound layer 272.

The switching TFT 204 is comprised of: a conductive layer 224 having a second taper shape and functioning as a gate electrode; channel regions 214a and 214b; first impurity regions 215a and 217 to function as source regions or drain regions; a second impurity region (A) 215b serving as an LDD region that does not overlap the gate electrode 224; and a second impurity region (B) 215c serving as an LDD region that partially overlaps the gate electrode 224. The length of a portion where the second impurity region (B) 215c overlaps the gate electrode 224 is set to 0.1 to 0.3 μm. The capacitor storage is comprised of: a semiconductor layer extended from the first impurity region 217 and having a second impurity region (A) 219b, a second impurity region (B) 219c, and a region 218 that is not doped with any impurity element for setting the conductivity type of the region; an insulating layer of the same layer as a gate insulating film having a third shape; and a capacitor wiring line 225 that is formed form a conductive layer having a second taper shape.

In the light-emitting device of this embodiment, if there is a pin hole in the organic compound layer 272, it causes a defect portion where the pixel electrode 271 and the cathode 273 are brought into contact through the pin hole. The defect portion can be changed into a transmuted portion 274 by the repairing method of the present invention, resulting in a raise in resistance. Therefore the other part of the pixel than the pin hole can have increased luminance and degradation of a part of the organic compound layer that surrounds the pin hole is not accelerated.

The structure of this embodiment can be combined with any of Embodiments 1, 2, 3, and 8.

[Embodiment 8]

An outline of a cross sectional structure of a light-emitting device using the repair method of the present invention is explained in this embodiment.

Figure 16:
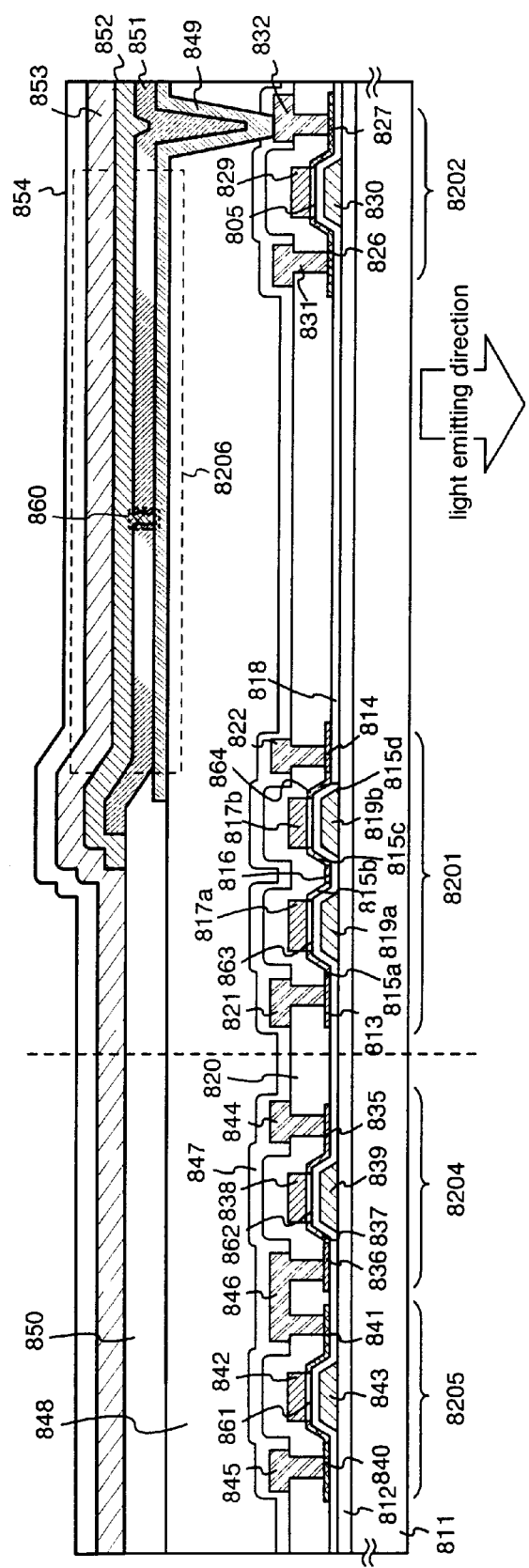
FIG. 16 is a cross sectional diagram of a light-emitting device of Embodiment 7.
Figure 17:
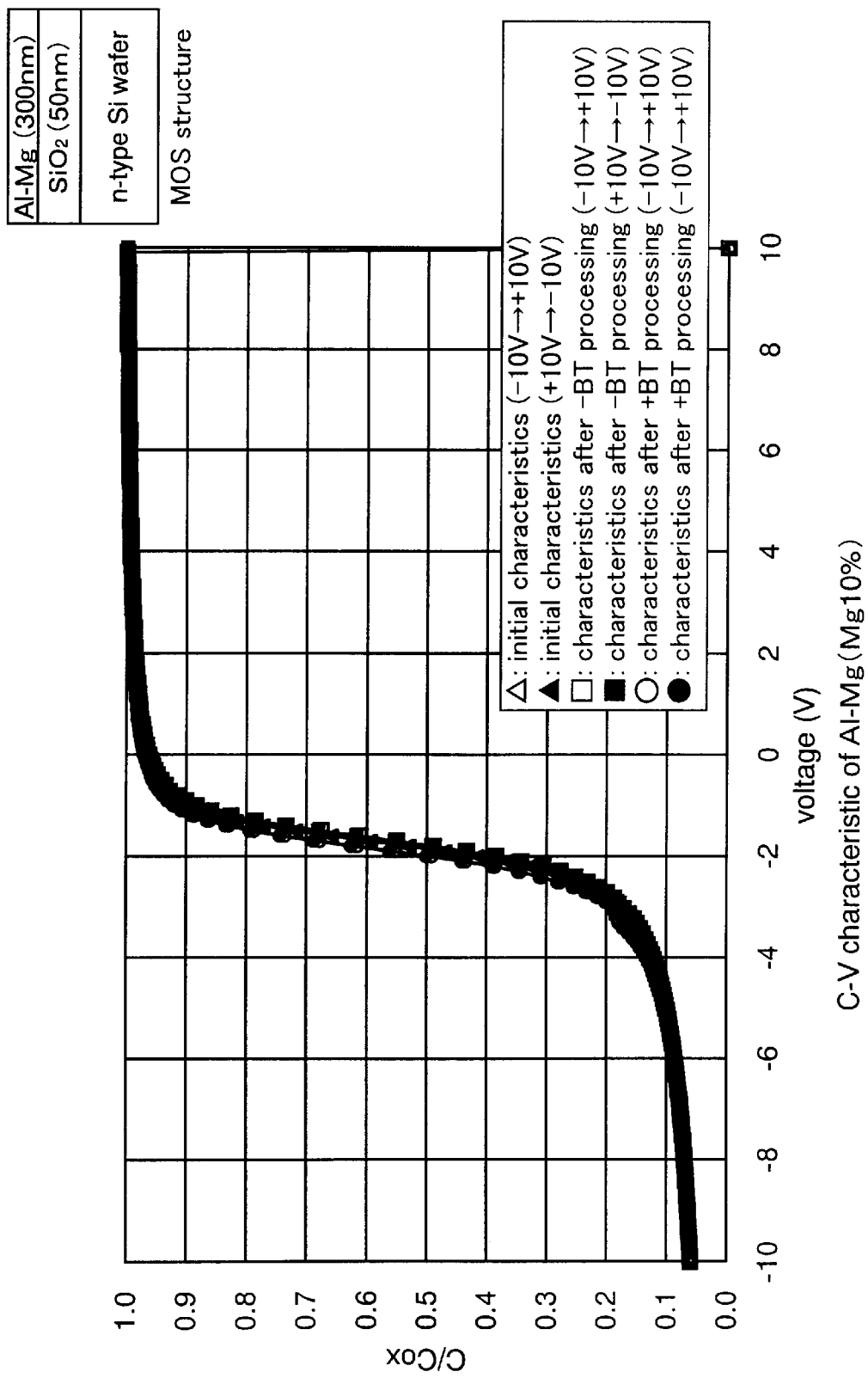
FIG. 17 is a diagram showing a MOS structure in which AlMg is used as an electrode, and the capacitance-voltage characteristics of the MOS structure.
Figure 18:
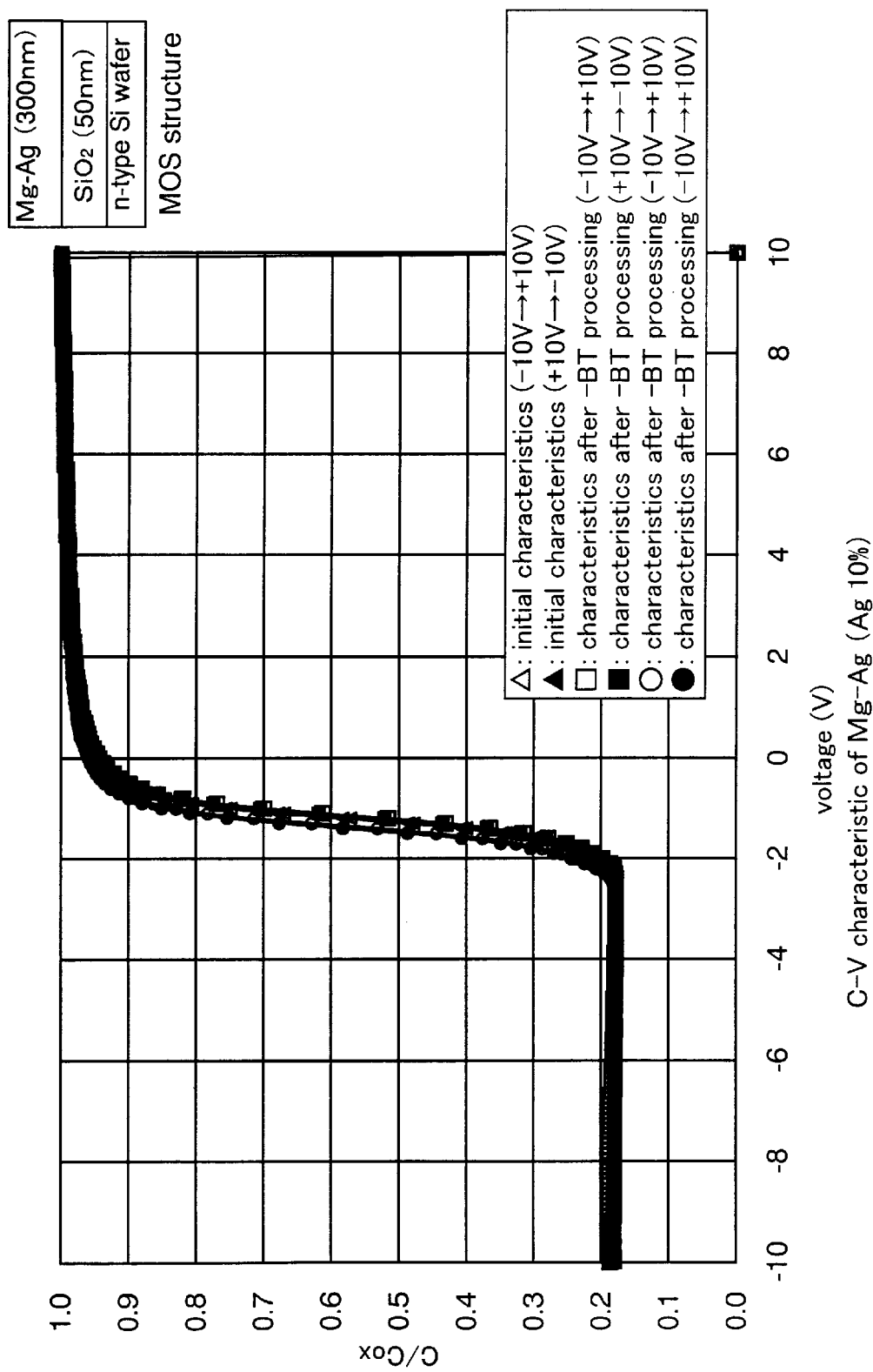
FIG. 18 is a diagram showing a MOS structure in which MgAg is used as an electrode, and the capacitance-voltage characteristics of the MOS structure.

Reference numeral 811 denotes a substrate in FIG. 16, and reference numeral 812 denotes an insulating film which becomes a base (hereafter referred to as a base film). A light transmitting substrate, typically a glass substrate, a quartz substrate, a glass ceramic substrate, or a crystalline glass substrate can be used as the substrate 811. However, the substrate used must be one able to withstand the highest process temperature during the manufacturing processes.

Further, the base film 812 is particularly effective when using a substrate containing mobile ions or a substrate which has conductivity, but the base film 812 need not be formed on a quartz substrate. An insulating film containing silicon may be used as the base film 812. Note that the term insulating film containing silicon specifically indicates an insulating film such as a silicon oxide film, a silicon nitride film, and a silicon oxynitride film (denoted as SiOxNy, where x and y are arbitrary integers) containing oxygen or nitrogen at predetermined ratios with respect to silicon.

Reference numeral 8201 denotes a switching TFT, reference numeral 8202 denotes a driver TFT, and both are formed by n-channel TFT and p-channel TFTs respectively. When the direction of light emitted is toward the substrate lower side (surface where TFTs and the organic compound layer are not formed), the above structure is preferable. However, the present invention is not limited to this structure. The switching TFT and the driver TFT may be either n-channel TFTs or p-channel TFTs.

The switching TFT 8201 has an active layer containing a source region 813, a drain region 814, LDD regions 815a to 815d, a separation region 816, and an active layer including channel regions 817a and 817b, a gate insulating film 818, gate electrodes 819a and 819b, a first interlayer insulating film 820, a source signal line 821 and a drain wiring 822. Note that the gate insulating film 818 and the first interlayer insulating film 820 may be common among all TFTs on the substrate, or may differ depending upon the circuit or the element.

Furthermore, the switching TFT 8201 shown in FIG. 16 is electrically connected to the gate electrodes 817a and 817b, becoming namely a double gate structure. Not only the double gate structure, but also a multi-gate structure (a structure containing an active layer having two or more channel regions connected in series) such as a triple gate structure, may of course also be used.

The multi-gate structure is extremely effective in reducing the off current, and provided that the off current of the switching TFT is sufficiently lowered, a capacitor connected to the gate electrode of the driver TFT 8202 can be have its capacitance reduced to the minimum necessary. Namely, the surface area of the capacitor can be made smaller, and therefore using the multi-gate structure is also effective in expanding the effective light emitting surface area of the organic light emitting elements.

In addition, the LDD regions 815a to 815d are formed so as not to overlap the gate electrodes 819a and 819b through the gate insulating film 818 in the switching TFT 8201. This type of structure is extremely effective in reducing the off current. Furthermore, the length (width) of the LDD regions 815a to 815d may be set from 0.5 to 3.5 $\mu$m, typically between 2.0 and 2.5 $\mu$m.

Note that forming an offset region (a region which is a semiconductor layer having the same composition as the channel region and to which the gate voltage is not applied) between the channel region and the LDD region is additionally preferable in that the off current is lowered. Further, when using a multi-gate structure having two or more gate electrodes, the separation region 816 (a region to which the same impurity element, at the same concentration, as that added to the source region or the drain region, is added) is effective in reducing the off current.

Next, the driver TFT 8202 is formed having an active layer containing a source region 826, a drain region 827, and a channel region 829; the gate insulating film 818; a gate electrode 830, the first interlayer insulating film 820; a source wiring 831; and a drain wiring 832. The driver TFT 8202 is a p-channel TFT in Embodiment 8.

Further, the drain region 814 of the switching TFT 8201 is connected to the gate electrode 830 of the driver TFT 8202. Although not shown in the figure, specifically the gate electrode 830 of the driver TFT 8202 is electrically connected to the drain region 814 of the switching TFT 8201 through the drain wiring (also referred to as a connection wiring) 822. The source wiring 831 of the driver TFT 8202 is connected to an power source supply line (not shown in the figure).

The driver TFT 8202 is an element for controlling the amount of electric current injected to the organic light emitting element, and a relatively large amount of current flows. It is therefore preferable to design the channel width W to be larger than the channel width of the switching TFT. Further, it is preferable to design the channel length L such that an excess of electric current does not flow in the driver TFT 8202. It is preferable to have from 0.5 to 2 $\mu$A (more preferably between 1 and 1.5 $\mu$A) per pixel.

In addition, by making the film thickness of the active layers (particularly the channel region) of the driver TFT 8202 thicker (preferably from 50 to 100 nm, even better between 60 and 80 nm), deterioration of the TFT may be suppressed. Conversely, it is also effective to make the film thickness of the active layer (particularly the channel region) thinner (preferably from 20 to 50 nm, even better between 25 and 40 nm), from the standpoint of making the off current smaller, for the case of the switching TFT 8201.

The structures of the TFTs formed within the pixel are explained above, but a driver circuit is also formed simultaneously at this point. A CMOS circuit, which becomes a basic unit for forming the driver circuit, is shown in FIG. 16.

A TFT having a structure in which hot carrier injection is reduced without an excessive drop in the operating speed is used as an n-channel TFT 8204 of the CMOS circuit in FIG. 16. Note that the term driver circuit indicates a source signal line driver circuit and a gate signal line driver circuit here. It is also possible to form other logic circuit (such as a level shifter, an A/D converter, and a signal division circuit).

An active layer of the n-channel TFT 8204 of the CMOS circuit contains a source region 835, a drain region 836, an LDD region 837, and a channel region 838. The LDD region 837 overlaps with a gate electrode 839 through the gate insulating film 818.

Formation of the LDD region 837 on only the drain region 836 side is so as not to have drop the operating speed. Further, it is not necessary to be very concerned about the off current with the n-channel TFT 8204, and it is good to place more importance on the operating speed. Thus, it is desirable that the LDD region 837 is made to completely overlap the gate electrode to decrease a resistance component to a minimum. It is therefore preferable to eliminate so-called offset.

Furthermore, there is almost no need to be concerned with degradation of a p-channel TFT 8205 of the CMOS circuit, due to hot carrier injection, and therefore no LDD region need be formed in particular. Its active layer therefore contains a source region 840, a drain region 841, and a channel region 842, and a gate insulating film 818 and a gate electrode 843 are formed on the active layer. It is also possible, of course, to take measures against hot carrier injection by forming an LDD region similar to that of the n-channel TFT 8204.

The reference numerals 861 to 865 are a mask to form the channel region 842, 838, 817a, 817b, and 829.

Further, the n-channel TFT 8204 and the p-channel TFT 8205 have source wirings 844 and 845, respectively, on their source regions, through the first interlayer insulating film 820. In addition, the drain regions of the n-channel TFT 8204 and the p-channel TFT 8205 are mutually connected electrically by a drain wiring 846.

Next, reference numeral 847 denotes a first passivation film, and its film thickness may be set from 10 nm to 1 μm (preferably between 200 and 500 nm). An insulating film containing silicon (in particular, it is preferable to use an oxidized silicon nitride film or a silicon nitride film) can be used as the passivation film material. The passivation film 847 possesses a role of protecting the TFTs from alkaline metals and moisture. Further, reference numeral 848 denotes a second interlayer insulating film, which has a function as a leveling film for performing leveling of a step due to the TFTs. An organic resin film is preferable as the second interlayer insulating film 848, and one such as polyimide, polyamide, acrylic, or BCB (benzocyclobutene) may be used. These organic resin films have the advantages of easily forming a good, level surface, having a low specific dielectric constant. The organic compound layer is extremely sensitive to unevenness, and therefore it is preferable to mostly absorb the TFT step by the second interlayer insulating film 848. In addition, it is preferable to form the low specific dielectric constant material thickly in order to reduce the parasitic capacitance formed between the gate signal wiring, the data signal wiring and the cathode of the organic light emitting element. The thickness, therefore, is preferably from 0.5 to 5 μm (more preferably between 1.5 and 2.5 μm).

Further, reference numeral 849 denotes a pixel electrode (organic light emitting element anode) made from a transparent conducting film. After forming a contact hole (opening) in the second interlayer insulating film 848 and in the first passivation film 847, the pixel electrode 849 is formed so as to be connected to the drain wiring 832 of the driver TFT 8202.

A third interlayer insulating film 850 is formed on the pixel electrode 849 from a silicon oxide film, a silicon oxynitride film, or an organic resin film, with a thickness of from 0.3 to 1 μm. An open portion is formed in the third interlayer insulating film 850 over the pixel electrode 849 by etching, and the edge of the open portion is etched so as to become a tapered shape. The taper angle may be set from 10 to 60°, (preferably between 30 and 50°).

An organic compound layer 851 is formed on the third interlayer insulating film 850. A single layer structure or a lamination structure can be used for the organic compound layer 851, but the lamination structure has a better light emitting efficiency. In general, a hole injecting layer, a hole transporting layer, a light emitting layer, and an electron transporting layer are formed in order on the pixel electrode, but a structure having a hole transporting layer, a light emitting layer, and an electron transporting layer, or a structure having a hole injecting layer, a hole transporting layer, a light emitting layer, an electron transporting layer, and an electron injecting layer may also be used. Any known structure may be used by the present invention, and doping of such as a fluorescing pigment into the organic compound layer may also be performed.

The structure of FIG. 16 is an example of a case of forming three types of organic light emitting elements corresponding to R, G, and B. Note that although only one pixel is shown in FIG. 16, pixels having an identical structure are formed corresponding to red, green and blue colors, respectively, and that color display can thus be performed. It is possible to implement the present invention without concern as to the method of color display.

A cathode 852 of the organic light emitting element is formed on the organic compound layer 851. A material containing a low work coefficient material such as magnesium (Mg), lithium (Li), or calcium (Ca), is used as the cathode 852. Preferably, an electrode made from MgAg (a material made from Mg and Ag at a mixture of Mg:Ag= 10:1) or an electrode made from AlMg (a material made from Mg and Al at a mixture of Mg:Al=5:95) are used. In addition, a MgAgAl electrode can be given as other examples.

The organic compound light emitting element 8206 is formed by the pixel electrode (anode) 849, the organic compound layer 851, and the cathode 852.

The lamination body comprising the organic compound layer 851 must be formed separately for each pixel, but the organic compound layer 851 is extremely weak with respect to moisture, and consequently a normal photolithography technique cannot be used. It is therefore preferable to use a physical mask material such as a metal mask, and to selectively form the layers by a gas phase method such as vacuum evaporation, sputtering, or plasma CVD.

Note that it is also possible to use a method such as ink jet printing, screen printing or spin coating as the method of selectively forming the organic compound layer. However, the cathode cannot be formed in succession with these methods at present, and therefore it is preferable to use the other methods stated above.

Further, reference numeral 853 denotes a protecting electrode, which protects the cathode 852 from external moisture and the like at the same time is an electrode for connecting to the cathode 852 of each pixel. It is preferable to use a low resistance material containing aluminum (Al), copper (Cu), or silver (Ag) as the protecting electrode 853. The protecting electrode 853 can also be expected to have a heat radiating effect which relieves the amount of heat generated by the organic compound layer.

Reference numeral 854 denotes a second passivation film, which may be formed with a film thickness of 10 nm to 1 μm (preferably between 200 and 500 nm). The aim of forming the second passivation film 854 is mainly for protecting the organic compound layer 851 from moisture, but it is also effective to give the second passivation film 854 a heat radiating effect. Note that the organic compound layer is weak with respect to heat, as stated above, and therefore it is preferable to perform film formation at as low a temperature as possible (preferably within a temperature range from room temperature to 120° C.). Plasma CVD, sputtering, vacuum evaporation, ion plating, and solution coating (spin coating) can therefore be considered as preferable film formation methods.

Note that it goes without saying that all of the TFTs shown in FIG. 16 may have a polysilicon film as their active layer in the present invention.

When the pinhole is formed in the organic compound layer 860 in the light-emitting device, the defective portion that the pixel electrode 849 and the cathode 852 are connecting through the pinhole is formed. By the repair method of the present invention, resistance can be higher by changing the defective portion to the denatured portion 860.

Therefore, the brightness in the portion other than the pinhole of the pixel are raised, and the deterioration of the organic compound layer surrounding of the pinhole can be prevented the promotion.

Note that it is possible to implement this embodiment combination with Embodiments 1, 2, 3, and 8.

[Embodiment 9]

A light-emitting device using an organic compound element is self-luminous and therefore is superior in visibility in bright surroundings compared to liquid crystal display devices and has wider viewing angle. Accordingly, it can be used for display units of various electric equipment.

Given as examples of electric equipment employing a light-emitting device to which a repairing method of the present invention is applied are: a video camera; a digital camera; a goggle type display (head mounted display); a navigation system; an audio reproducing device (car audio, an audio component, and the like); a notebook computer; a game machine; a portable information terminal (a mobile computer, a portable telephone, a portable game machine, an electronic book, etc.); and an image reproducing device (specifically, a device capable of processing data in a recording medium such as a digital versatile disk (DVD) and having a display device that can display the image of the data). The light-emitting device having an organic compound element is desirable particularly for a portable information terminal since its screen is often viewed obliquely and is required to have a wide viewing angle. Specific examples of the electric equipment are shown in FIGS. 11A to 11H.

Figure 11A:
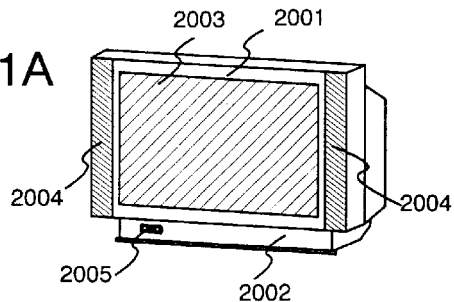
FIGS. 11A to 11H are electronic equipment having light-emitting devices which use the repairing method of Embodiment 10 of the present invention.

FIG. 11A shows a display device, which comprises a casing 2001, a supporting base 2002, a display unit 2003, speaker units 2004, a video input terminal 2005, etc. The light-emitting device to which the repairing method of the present invention is applied can be used for the display unit 2003. The light-emitting device having an organic light emitting element is self-luminous and does not need a backlight, so that it can make a thinner display unit than liquid display devices can. The term display device includes every display device for displaying information such as one for a personal computer, one for receiving TV broadcasting, and one for advertisement.

Figure 11B:
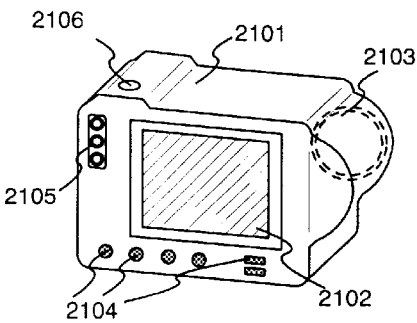

FIG. 11B shows a digital still camera, which comprises a main body 2101, a display unit 2102, an image receiving unit 2103, operation keys 2104, an external connection port 2105, a shutter 2106, etc. The light-emitting device to which the repairing method of the present invention is applied can be used for the display unit 2102.

Figure 11C:
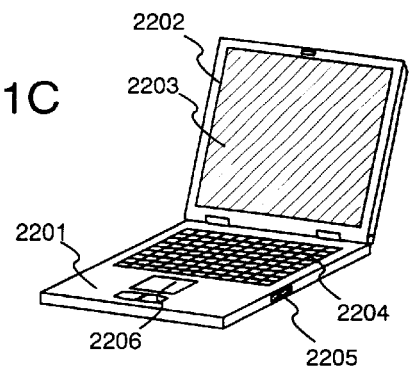

FIG. 11C shows a notebook computer, which comprises a main body 2201, a casing 2202, a display unit 2203, a keyboard 2204, an external connection port 2205, a pointing mouse 2206, etc. The light-emitting device to which the repairing method of the present invention is applied can be used for the display unit 2203.

Figure 11D:
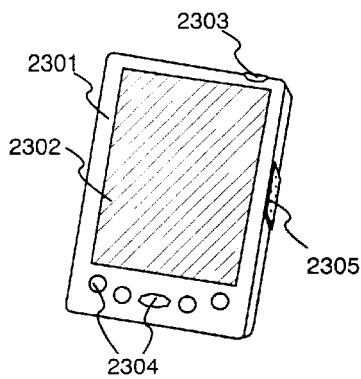

FIG. 11D shows a mobile computer, which comprises a main body 2301, a display unit 2302, a switch 2303, operation keys 2304, an infrared ray port 2305, etc. The light-emitting device to which the repairing method of the present invention is applied can be used for the display unit 2302.

Figure 11E:
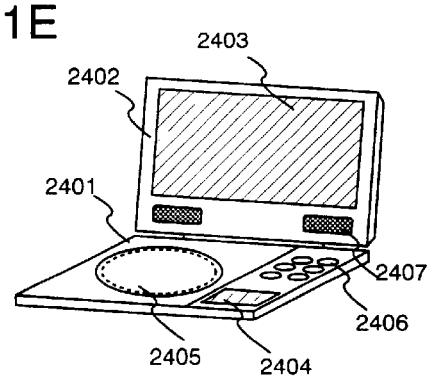

FIG. 11E shows a portable image reproducing device equipped with a recording medium (a DVD player, to be specific). The device comprises a main body 2401, a casing 2402, a display unit A 2403, a display unit B 2404, a recording medium (DVD) reading unit 2405, operation keys 2406, speaker units 2407, etc. The display unit A 2403 mainly displays image information whereas the display unit B 2404 mainly displays text information. The light-emitting device to which the repairing method of the present invention is applied can be used for the display units A 2403 and B 2404. The term image reproducing device equipped with a recording medium includes video game machines.

Figure 11F:
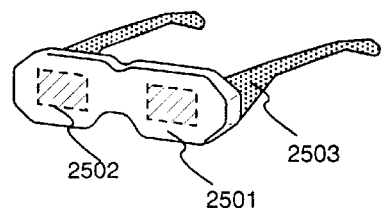

FIG. 11F shows a goggle type display (head mounted display), which comprises a main body 2501, display units 2502, and arm units 2503. The light-emitting device to which the repairing method of the present invention is applied can be used for the display units 2502.

Figure 11G:
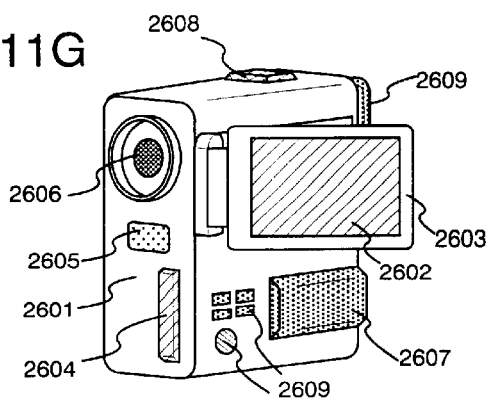

FIG. 11G shows a video camera, which comprises a main body 2601, a display unit 2602, a casing 2603, an external connection port 2604, a remote control receiving unit 2605, an image receiving unit 2606, a battery 2607, an audio input unit 2608, operation keys 2609, etc. The light-emitting device to which the repairing method of the present invention is applied can be used for the display unit 2602.

Figure 11H:
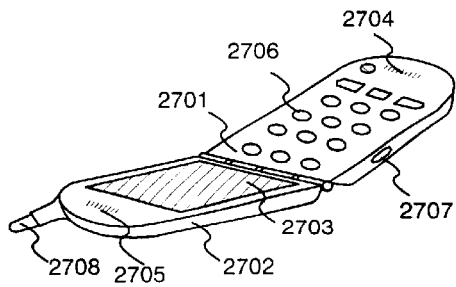
Figure 12A:
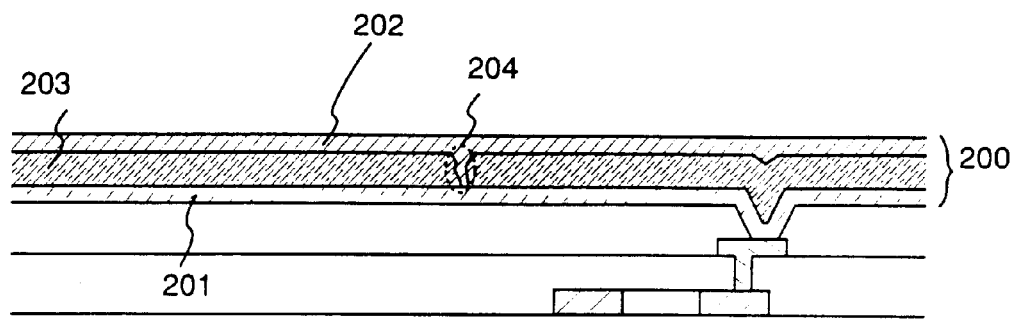
FIGS. 12A and 12B are diagrams showing schematically a cross sectional diagram of an organic light emitting element having a defect portion, and electric current flowing when a forward bias current flows in the organic light emitting element, respectively.
Figure 12B:
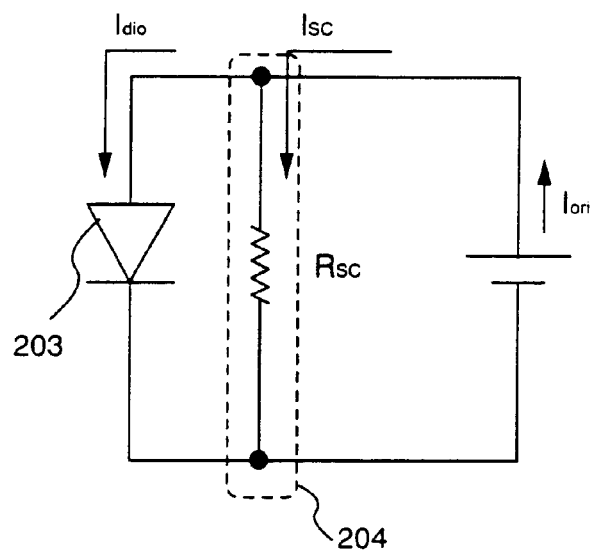
Figure 13A:
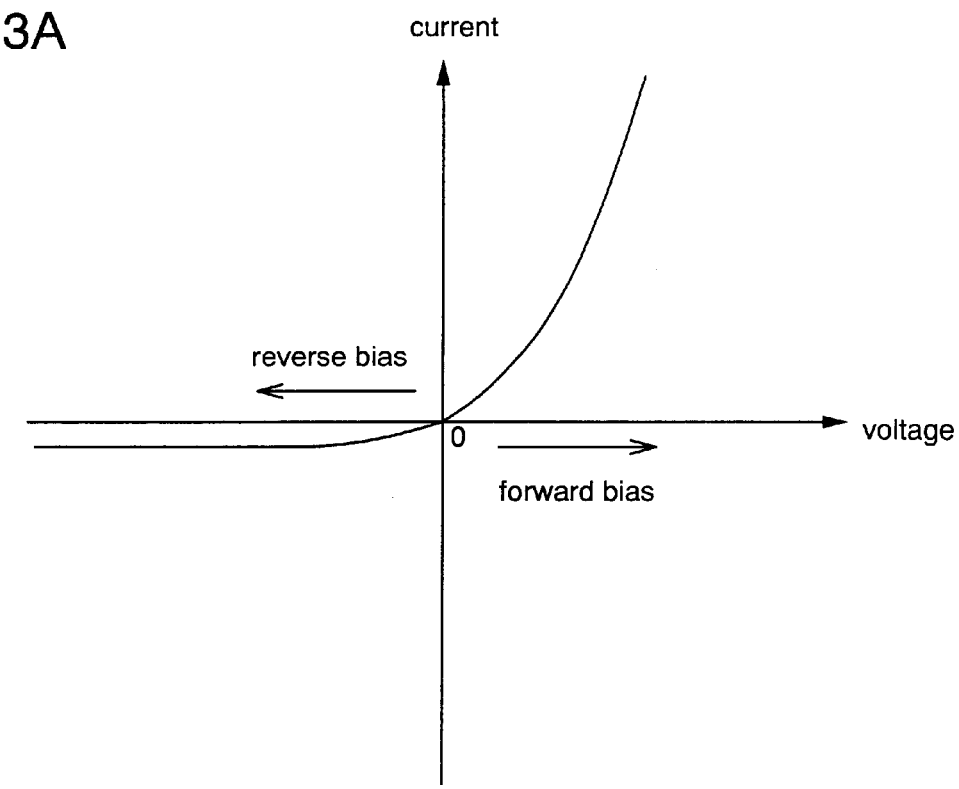
FIGS. 13A and 13B are diagrams showing the voltage-current characteristics of an organic light emitting element.
Figure 13B:
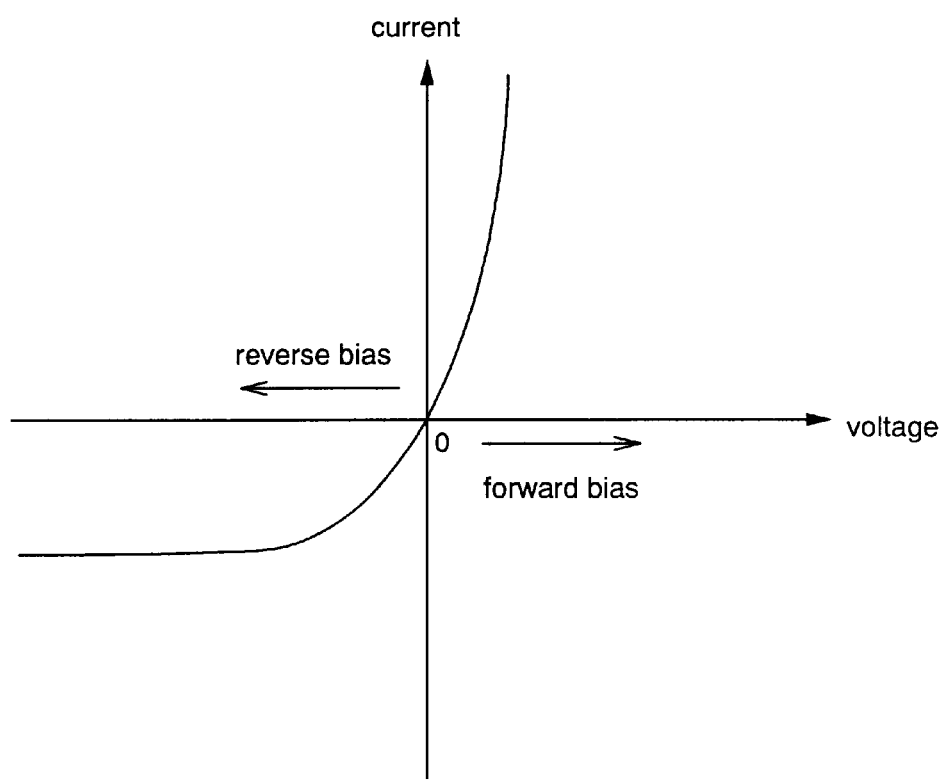

FIG. 11H shows a portable telephone, which comprises a main body 2701, a casing 2702, a display unit 2703, an audio input unit 2704, an audio output unit 2705, operation keys 2706, an external connection port 2707, an antenna 2708, etc. The light-emitting device to which the repairing method of the present invention is applied can be used for the display unit 2703. If the display unit 2703 displays white characters on a black background, power consumption of the portable telephone can be reduced.

If the luminance of light emitted from organic compound materials is increased in future, the light-emitting device having an organic light emitting element can be used also in a front or rear projector in which light bearing outputted image information is magnified by a lens or the like to be projected on a screen.

The electric equipment given in the above often displays information distributed through electronic communication lines such as Internet and CATV (cable television), especially, animation information with increasing frequency. The light-emitting device having an organic light emitting element is suitable for displaying animation information since organic light emitting materials have fast response speed.

In the light-emitting device, portions that emit light consume power. Therefore it is desirable to display information such that as small portions as possible emit light. Accordingly, if the light-emitting device is used for a display unit that mainly displays text information such as a portable information terminal, in particular, a portable telephone, and an audio reproducing device, it is desirable to assign light emitting portions to display text information while portions that do not emit light serve as the background.

As described above, the application range of the light-emitting device to which the repairing method of the present invention is applied is very wide and electric equipment of every field can employ the device. The electric equipment in this embodiment may use any of the structures shown in Embodiments 1 to 7.

[Embodiment 10]

A case of applying the repairing method of the present invention to a passive type (simple matrix type) light-emitting device is explained in Embodiment 10.

Figure 20A:
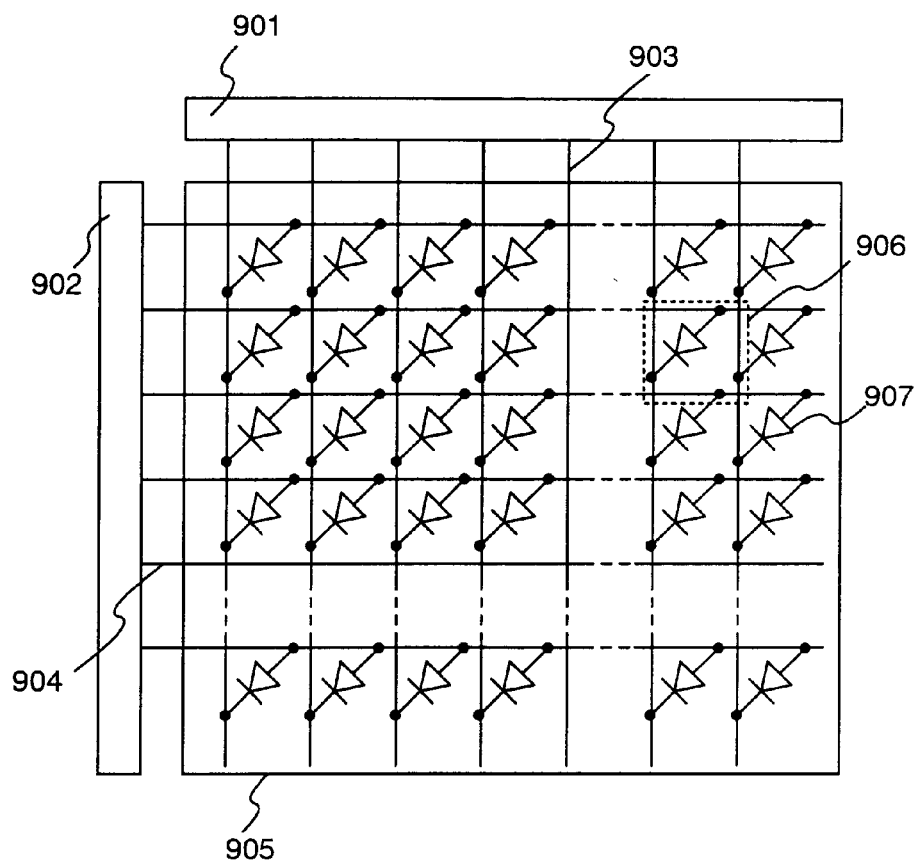
FIGS. 20A and 20B are diagrams of a case of using the repairing method of the present invention for a passive type light-emitting device.

The structure of a passive type light-emitting device is shown in FIG. 20A. Reference numeral 905 denotes a pixel portion, and the pixel portion 905 has a plurality of pixels 906. Each pixel has one of a plurality of data lines 903, and one of a plurality of scanning lines 904. An organic compound layer is formed between the data lines and the scanning lines 904, and the data lines 903 and the scanning lines 904 becomes electrodes, thus forming organic light emitting elements 907.

Signals input to the data lines 903 are controlled in a data line driver circuit 901, and signals input to the scanning lines 904 are controlled in a scanning line driver circuit 902.

Figure 20B:
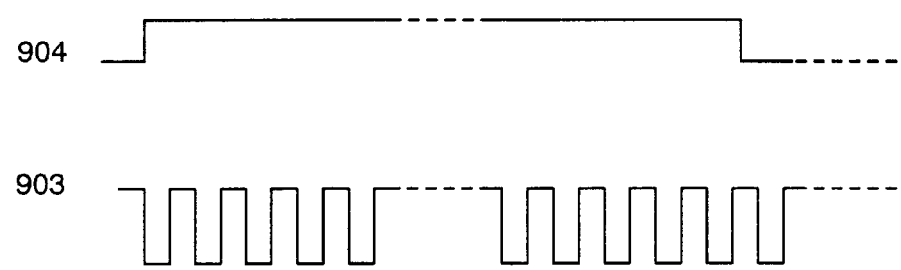

The voltage size for the signals input to the scanning lines 904 and the data lines 903 when the repairing method of the present invention is used are shown in FIG. 20B. A predetermined reverse bias electric current flows in the organic light emitting elements 907 during fixed periods of time by fixing the voltage of each of the scanning lines 904, and changing the voltage of the data lines at the fixed periods of time.

Note that repair of defects in the organic light emitting elements 907 may be performed once for all of the pixels 906 in the pixel portion 905, may be performed line by line for single lines of pixels, or may be performed for each pixel individually.

Even if pinholes are formed due to the influence of refuse or the like during film formation of the organic compound layer, thus forming short circuits between two layers formed sandwiching the organic compound layer, use of the method of the present invention can increase the resistance of a short-circuited defect portion. In addition, the actual amount of electric current flowing in the organic compound layer when a forward bias voltage is applied to the organic light emitting element can be increased. The brightness of light emission can therefore be increased when the same voltage is applied, even if a defect portion exists, in accordance with the repairing method of the present invention.

Furthermore, electric current always flows in the defect portion, and degradation of the organic compound layer existing in the vicinity of the defect portion is easily promoted. However, a denatured layer has a high resistance $R_{SC}$. It thus becomes more difficult for current to flow, and promotion of degradation of the organic compound layer existing in the vicinity of the denatured layer can be prevented.

It is possible to implement Embodiment 10 by freely combining it with Embodiments 4, 5, and 9.

In accordance with the aforementioned structures, the present invention can increase the resistance of short-circuited defect portions even if pinholes are formed due to the influence of refuse and the like during organic compound film formation, thus forming short circuits between two layers formed sandwiching an organic compound layer. In addition, the actual electric current flowing in the organic compound layer when a forward bias voltage is applied to organic light emitting elements can be increased. The brightness of light emission can therefore be increased when the same voltage is applied, even if the defect portion exists, in accordance with the repairing method of the present invention.

Further, electric current always flows in the defect portion, and therefore degradation of the organic compound layer existing in the vicinity of the defect portion is easily promoted. However, a denatured layer has a high resistance $R_{SC}$, and therefore electric current does not easily flow, and the promotion of degradation in the organic compound layer existing in the vicinity of the denatured layer can be prevented.

In addition, contamination of devices such as organic light emitting elements and TFTs when a reverse bias is applied to the organic light emitting elements can be prevented by forming the cathodes of the organic light emitting elements such that they contain as little Na and Li as possible.

What is claimed is:

1. A method of repairing a light-emitting device comprising an organic light emitting element having an anode, a cathode, and an organic compound layer interposed therebetween, wherein a concentration of at least one of Li and Na contained in the cathode is $1 \times 10^{18}$ atoms/cm$^3$ or less, the method comprising:
    applying a reverse bias voltage between the anode and the cathode.

2. A method of repairing a light-emitting device according to claim 1, wherein the cathode is an alloy containing at least one selected from the group consisting of Be, Mg, Ca, Sr and Ba.

3. A method of repairing a light-emitting device according to claim 1, wherein the cathode is an alloy containing magnesium.

4. A method of repairing a light-emitting device according to claim 1, wherein the cathode is one selected from the group consisting of AlMg, MgAg and MgAgAl.

5. A method of repairing a light-emitting device according to claim 1, wherein the reverse bias voltage is applied during fixed periods of time.

6. A method of repairing a light-emitting device according to claim 1, wherein the reverse bias voltage is gradually increased during the application until it settles within ±15% of the height at which an avalanche current begins to flow within the organic compound layer.

7. A method of repairing a light-emitting device according to claim 1, wherein the organic light emitting elements are arranged in a matrix shape, and a thin film transistor is connected to each of the organic light emitting elements.

8. A method of repairing a light-emitting device according to claim 1, wherein the light-emitting device is incorporated in at least one selected from the group consisting of a display device, digital camera, a personal computer, a mobile computer, an image reproducing device, a goggle-type display, a video camera, and a portable telephone.

9. A method of repairing a light-emitting device comprising an organic light emitting element having an anode, a cathode, and an organic compound layer interposed therebetween, wherein a concentration of at least one of Li and Na contained in the cathode is $1 \times 10^{18}$ atoms/cm$^3$ or less, the repairing method comprising:
    applying a reverse bias voltage between the anode and the cathode, thereby making an electric current flow in portions at which the anode and the cathode are electrically short-circuited, causing the short-circuited portions to emit heat, and making the portions that emit heat into higher resistance portions, or insulating portions.

10. A method of repairing a light-emitting device according to claim 9, wherein the cathode is an alloy containing at least one selected from the group consisting of Be, Mg, Ca, Sr and Ba.

11. A method of repairing a light-emitting device according to claim 9, wherein the cathode is an alloy containing magnesium.

12. A method of repairing a light-emitting device according to claim 9, wherein the cathode is one selected from the group consisting of AlMg, MgAg and MgAgAl.

13. A method of repairing a light-emitting device according to claim 9, wherein the reverse bias voltage is applied during fixed periods of time.

14. A method of repairing a light-emitting device according to claim 9, wherein the reverse bias voltage is gradually increased during the application until it settles within ±15% of the height at which an avalanche current begins to flow within the organic compound layer.

15. A method of repairing a light-emitting device according to claim 9, wherein the organic light emitting elements are arranged in a matrix shape, and a thin film transistor is connected to each of the organic light emitting elements.

16. A method of repairing a light-emitting device according to claim 9, wherein the light-emitting device is incorporated in at least one selected from the group consisting of a display device, digital camera, a personal computer, a mobile computer, an image reproducing device, a goggle-type display, a video camera, and a portable telephone.

17. A method of repairing a light-emitting device comprising an organic light emitting element having an anode, a cathode, and an organic compound layer interposed therebetween, wherein a concentration of at least one of Li and Na contained in the cathode is $1 \times 10^{18}$ atoms/cm$^3$ or less, and wherein the organic compound layer comprises a hole injecting layer, a hole transporting layer, an electron injecting layer, an electron transporting layer, and a light emitting layer, the repairing method comprising:
applying a reverse bias voltage between the anode and the cathode, thereby making an electric current flow in portions at which a layer on the light emitting layer and a layer under the light emitting layer are electrically short-circuited, causing the short-circuited portions to emit heat, and making the portions that emit heat into higher resistance portions, or insulating portions.

18. A method of repairing a light-emitting device according to claim 17, wherein the cathode is an alloy containing at least one selected from the group consisting of Be, Mg, Ca, Sr and Ba.

19. A method of repairing a light-emitting device according to claim 17, wherein the cathode is an alloy containing magnesium.

20. A method of repairing a light-emitting device according to claim 17, wherein the cathode is one selected from the group consisting of AlMg, MgAg and MgAgAl.

21. A method of repairing a light-emitting device according to claim 17, wherein the reverse bias voltage is applied during fixed periods of time.

22. A method of repairing a light-emitting device according to claim 17, wherein the reverse bias voltage is gradually increased during the application until it settles within ±15% of the height at which an avalanche current begins to flow within the organic compound layer.

23. A method of repairing a light-emitting device according to claim 17, wherein the organic light emitting elements are arranged in a matrix shape, and a thin film transistor is connected to each of the organic light emitting elements.

24. A method of repairing a light-emitting device according to claim 17, wherein the light-emitting device is incorporated in at least one selected from the group consisting of a display device, digital camera, a personal computer, a mobile computer, an image reproducing device, a goggle-type display, a video camera, and a portable telephone.

25. A method of repairing a light-emitting device comprising an organic light emitting element having an anode, a cathode, and an organic compound layer interposed therebetween, wherein a concentration of at least one of Li and Na contained in the cathode is $1 \times 10^{18}$ atoms/cm$^3$ or less, the repairing method comprising:
applying a reverse bias voltage between the anode and the cathode, thereby causing an electric current to flow in portions at which the anode and the cathode are in electrical contact.

26. A method of repairing a light-emitting device according to claim 25, wherein there is the electrical current flowing in portions at which the anode and the cathode are in electrical contact, causing heat to be emitted, and making the portions that emit heat into higher resistance portions, or insulating portions.

27. A Method of repairing a light-emitting device according to claim 25, wherein the cathode is an alloy containing at least one selected from the group consisting of Be, Mg, Ca, Sr and Ba.

28. A method of repairing a light-emitting device according to claim 25, wherein the cathode is an alloy containing magnesium.

29. A method of repairing a light-emitting device according to claim 25, wherein the cathode is one selected from the group consisting of AlMg, MgAg and MgAgAl.

30. A method of repairing a light-emitting device according to claim 25, wherein the reverse bias voltage is applied during fixed periods of time.

31. A method of repairing a light-emitting device according to claim 25, wherein the reverse bias voltage is gradually increased during the application until it settles within ±15% of the height at which an avalanche current begins to flow within the organic compound layer.

32. A method of repairing a light-emitting device according to claim 25, wherein the organic light emitting elements are arranged in a matrix shape, and a thin film transistor is connected to each of the organic light emitting elements.

33. A method of repairing a light-emitting device according to claim 25, wherein the light-emitting device is incorporated in at least one selected from the group consisting of a display device, digital camera, a personal computer, a mobile computer, an image reproducing device, a goggle-type display, a video camera, and a portable telephone.

34. A method of repairing a light-emitting device comprising an organic light emitting element having an anode, a cathode, and an organic compound layer interposed therebetween, wherein a concentration of at least one of Li and Na contained in the cathode is $1 \times 10^{18}$ atoms/cm$^3$ or less, and wherein the organic compound layer comprises a hole injecting layer, a hole transporting layer, an electron injecting layer, an electron transporting layer, and a light emitting layer, the repairing method comprising:
applying a reverse bias voltage between the anode and the cathode, thereby causing an electric current to flow in portions at which a layer on the light emitting layer and a layer under the light emitting layer are in electrical contact.

35. A method of repairing a light-emitting device according to claim 34, wherein there is the electrical current flowing in portions at which the layer on the light emitting layer and the layer under the light emitting layer are in electrical contact, causing heat to be emitted, and making the portions that emit heat into higher resistance portions, or insulating portions.

36. A method of repairing a light-emitting device according to claim 34, wherein the cathode is an alloy containing at least one selected from the group consisting of Be, Mg, Ca, Sr and Ba.

37. A method of repairing a light-emitting device according to claim 34, wherein the cathode is an alloy containing magnesium.

38. A method of repairing a light-emitting device according to claim 34, wherein the cathode is one selected from the group consisting of AlMg, MgAg and MgAgAl.

39. A method of repairing a light-emitting device according to claim 34, wherein the reverse bias voltage is applied during fixed periods of time.

40. A method of repairing a light-emitting device according to claim 34, wherein the reverse bias voltage is gradually increased during the application until it settles within ±15% of the height at which an avalanche current begins to flow within the organic compound layer.

41. A method of repairing a light-emitting device according to claim 34, wherein the organic light emitting elements are arranged in a matrix shape, and a thin film transistor is connected to each of the organic light emitting elements.

42. A method of repairing a light-emitting device according to claim 34, wherein the light-emitting device is incorporated in at least one selected from the group consisting of a display device, digital camera, a personal computer, a mobile computer, an image reproducing device, a goggle-type display, a video camera, and a portable telephone.

43. A method of manufacturing a light-emitting device comprising an organic light emitting element having an anode, a cathode, and an organic compound layer interposed therbetween, comprising:

forming the cathode so that a concentration of at least one of Li and Na contained therein is $1 \times 10^{18}$ atoms/cm$^3$ or less; and applying a reverse bias voltage between the anode and the cathode.

44. A method of manufacturing a light-emitting device according to claim 43, wherein the light-emitting device is incorporated in at least one selected from the group consisting of a display device, digital camera, a personal computer, a mobile computer, an image reproducing device, a goggle-type display, a video camera, and a portable telephone.

45. A method of manufacturing a light-emitting device comprising an organic light emitting element having an anode, a cathode, and an organic compound layer interposed therebetween, comprising:

forming the cathode so that a concentration of at least one of Li and Na contained in the cathode is $1 \times 10^{18}$ atoms/cm$^3$ or less; and applying a reverse bias voltage between the anode and the cathode, thereby making an electric current flow in portions at which the anode and the cathode are electrically short-circuited, causing the short-circuited portions to emit heat, and making the portions that emit heat into higher resistance portions, or insulating portions.

46. A method of manufacturing a light-emitting device according to claim 45, wherein the light-emitting device is incorporated in at least one selected from the group consisting of a display device, digital camera, a personal computer, a mobile computer, an image reproducing device, a goggle-type display, a video camera, and a portable telephone.

* * * * *